US008082483B2

United States Patent
Nguyen

(10) Patent No.: US 8,082,483 B2
(45) Date of Patent: Dec. 20, 2011

(54) HIGH SPEED TURBO CODES DECODER FOR 3G USING PIPELINED SISO LOG-MAP DECODERS ARCHITECTURE

(75) Inventor: Quang Nguyen, Glen Mills, PA (US)

(73) Assignee: ICOMM Technologies Inc., Wilmington, DE (US)

( * ) Notice: Subject to any disclaimer, the term of this patent is extended or adjusted under 35 U.S.C. 154(b) by 340 days.

(21) Appl. No.: 12/548,749

(22) Filed: Aug. 27, 2009

(65) Prior Publication Data
US 2009/0319862 A1    Dec. 24, 2009

Related U.S. Application Data

(63) Continuation-in-part of application No. 12/173,799, filed on Jul. 15, 2008, which is a continuation-in-part of application No. 90/008,190, filed on Aug. 25, 2006, which is a continuation-in-part of application No. 10/248,245, filed on Dec. 30, 2002, now Pat. No. 6,799,295, which is a continuation-in-part of application No. 09/681,093, filed on Jan. 2, 2001, now Pat. No. 6,813,742.

(51) Int. Cl.
*H03M 13/00* (2006.01)
(52) U.S. Cl. .................. 714/774; 714/775; 700/53
(58) Field of Classification Search .................. 714/774, 714/775; 700/53
See application file for complete search history.

(56) References Cited

U.S. PATENT DOCUMENTS

| 4,201,976 | A  | * | 5/1980  | Patel          | 714/804 |
| 6,405,342 | B1 | * | 6/2002  | Lee            | 714/792 |
| 6,865,237 | B1 | * | 3/2005  | Boariu et al.  | 375/295 |
| 6,898,248 | B1 | * | 5/2005  | Elgamal et al. | 375/259 |
| 6,956,872 | B1 | * | 10/2005 | Djokovic et al.| 370/505 |

* cited by examiner

*Primary Examiner* — M. Mujtaba K Chaudry

(57) ABSTRACT

A MIMO system with Diversity processing is provided having Turbo Codes Decoders for computing orthogonal signals from multiple separate antennas. The invention decodes multipath signals that have arrived at the terminal via different routes after being reflected from buildings, trees or hills. The Turbo Codes Decoder with Diversity processing increases the signal to noise ratio (SNR) more than 6 dB which enables the Wireless system to deliver data rates from up to 200 Mbit/s. The invention provides several improved Turbo Codes Decoder methods and devices that provide a more suitable, practical and simpler method for implementation a Turbo Codes Decoder in ASIC (Application Specific Integrated Circuits) or DSP codes. A Turbo Codes Decoder block is provided to compute baseband signals from multiple different receiver paths. Several pipelined max-Log-MAP decoders are used for iterative decoding of received data. A Sliding Window of Block N data is used for pipeline operations. In a pipeline mode, a first decoder A decodes block N data from a first source, while a second decoder B decodes block N data from a second source during the same clock cycle. Pipelined max-Log-MAP decoders provide high speed data throughput and one output per clock cycle.

1 Claim, 23 Drawing Sheets

Diversity Baseband Processor M-Channels Sub-systems

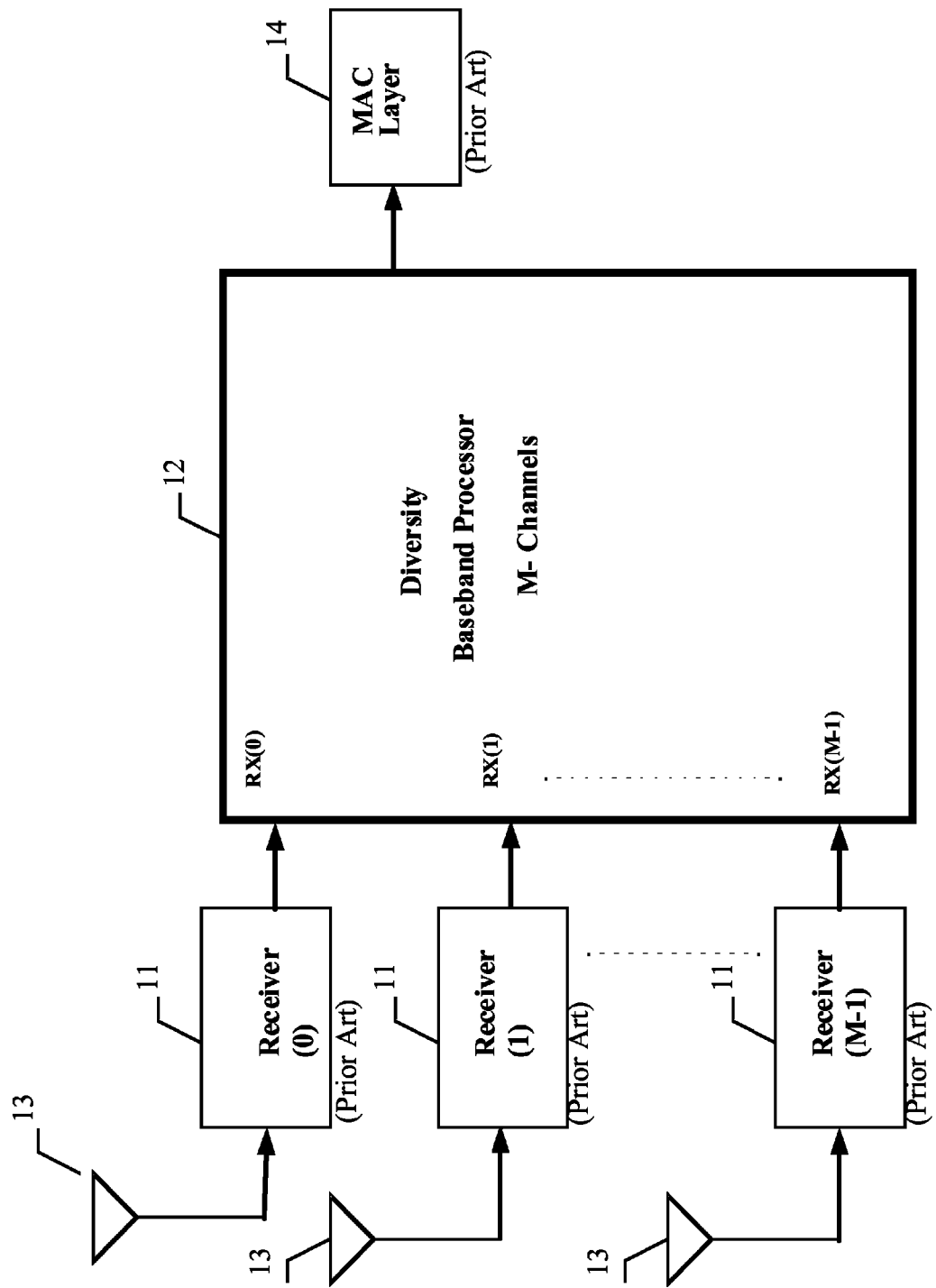
FIGURE 1. Typical diversity 3G Receiver Functional Block Diagram

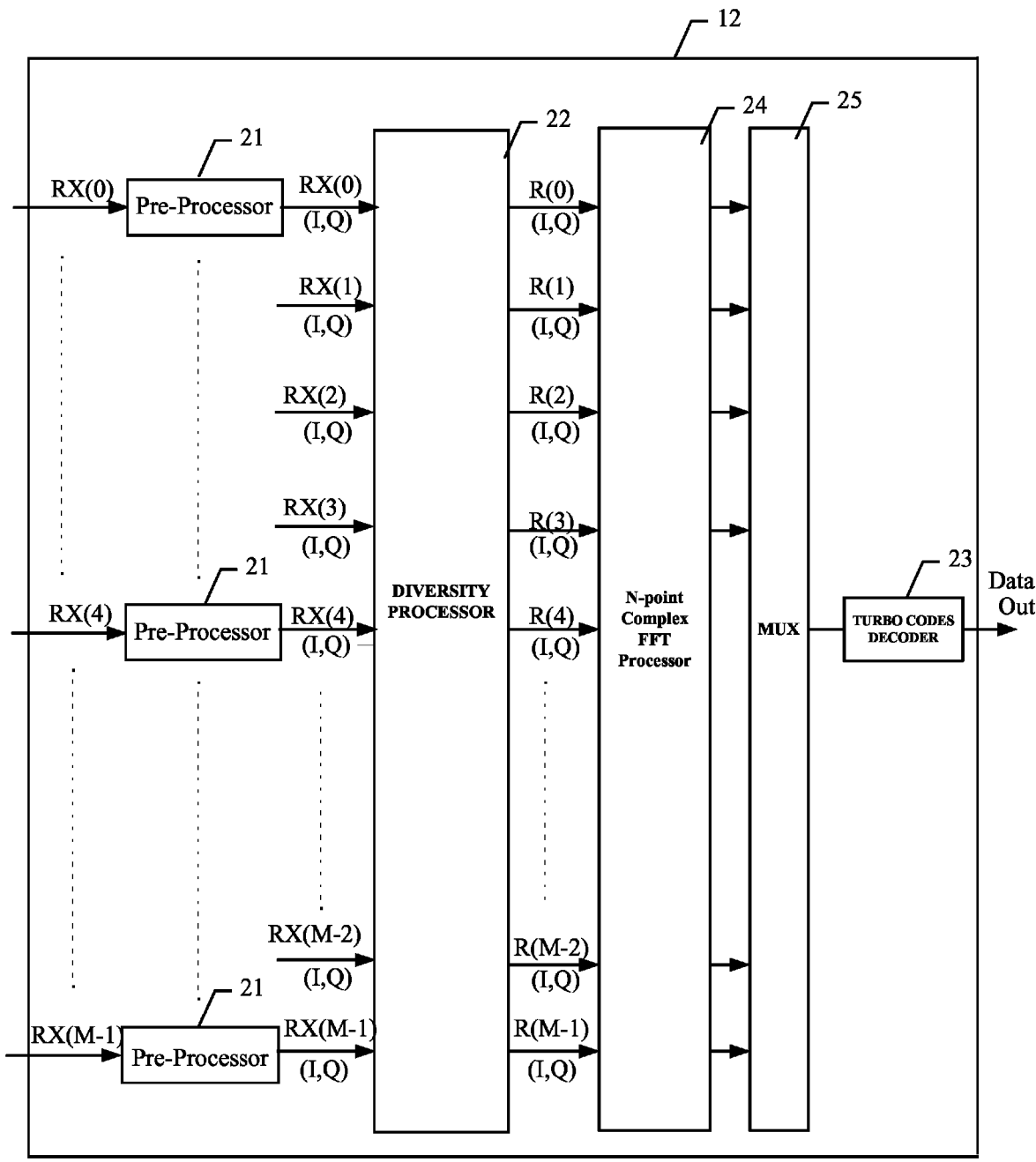
FIGURE 2. Diversity Baseband Processor M-Channels Sub-systems

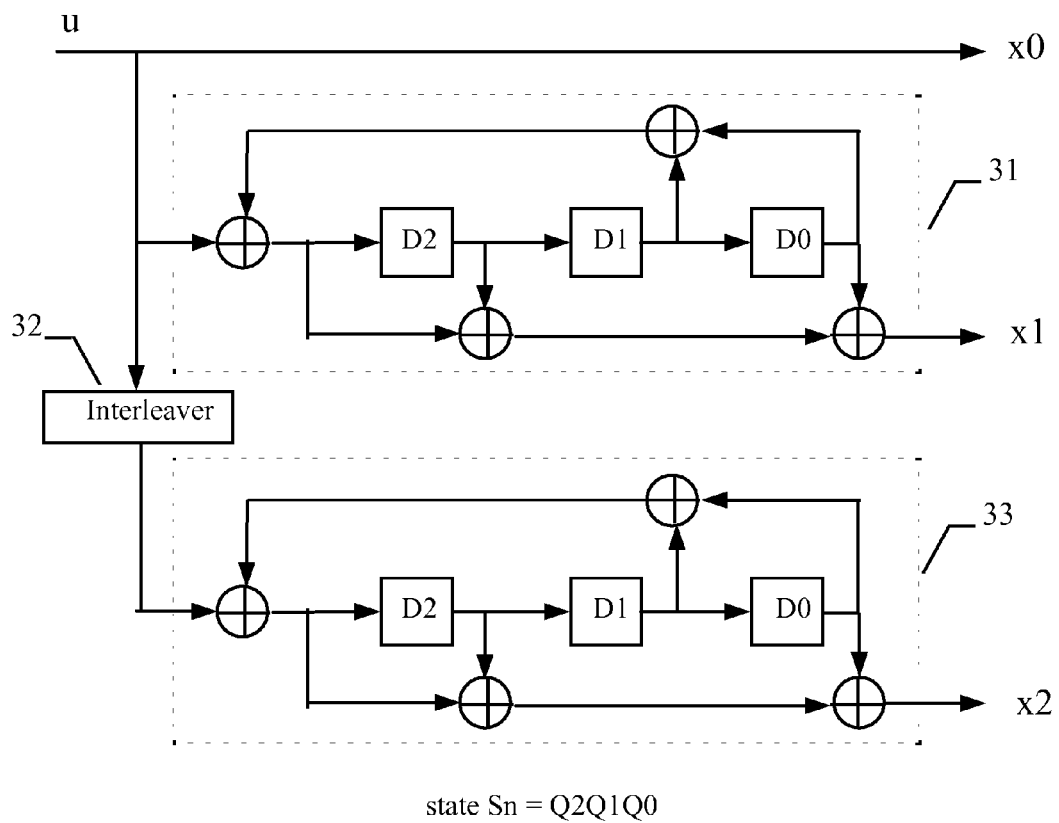
FIGURE 3. The Parallel Concatenated Convolutional Code (PCCC) with 8-states constituent encoder,
(Prior art)

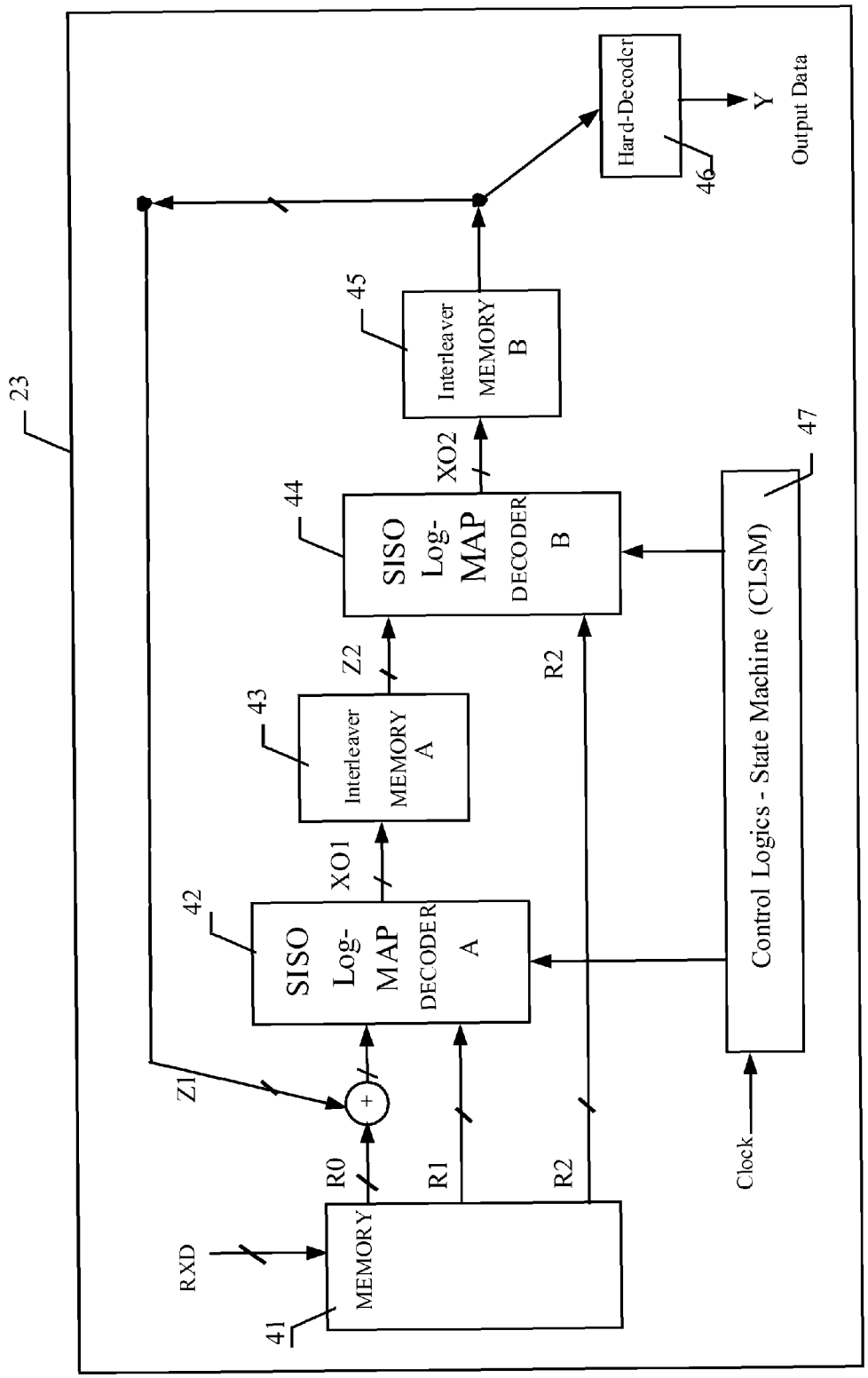
FIGURE 4. Baseband Processor Turbo Codes Decoder

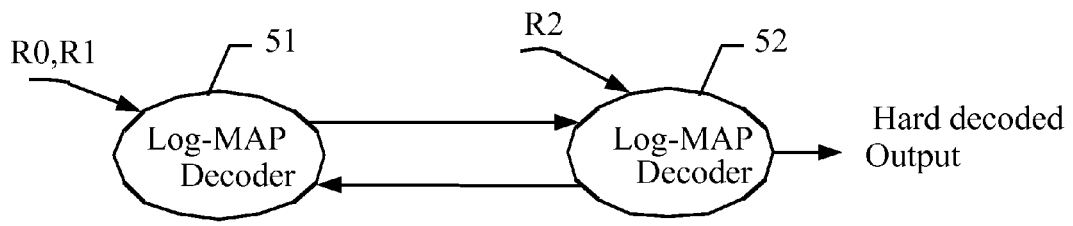
FIGURE 5. Turbo Codes Decoder State Diagram
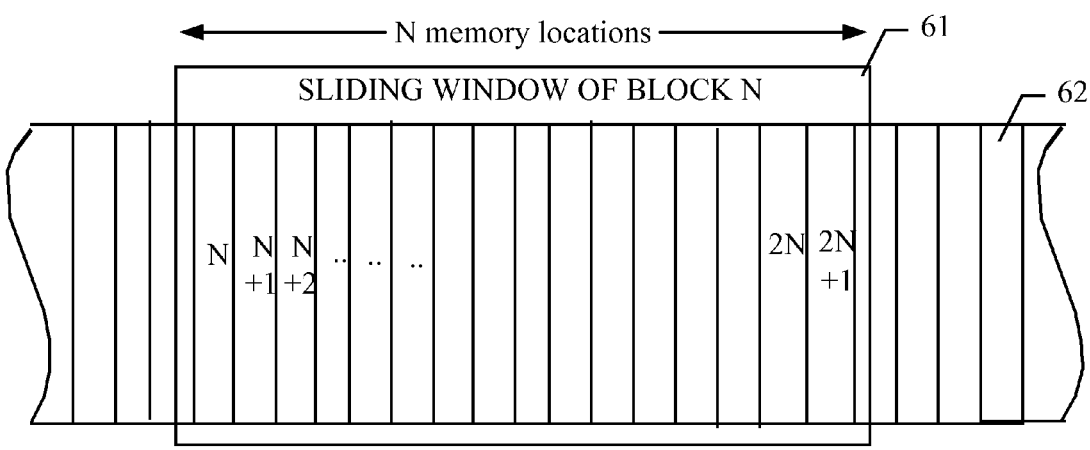
FIGURE 6. Block N Sliding Window Diagram

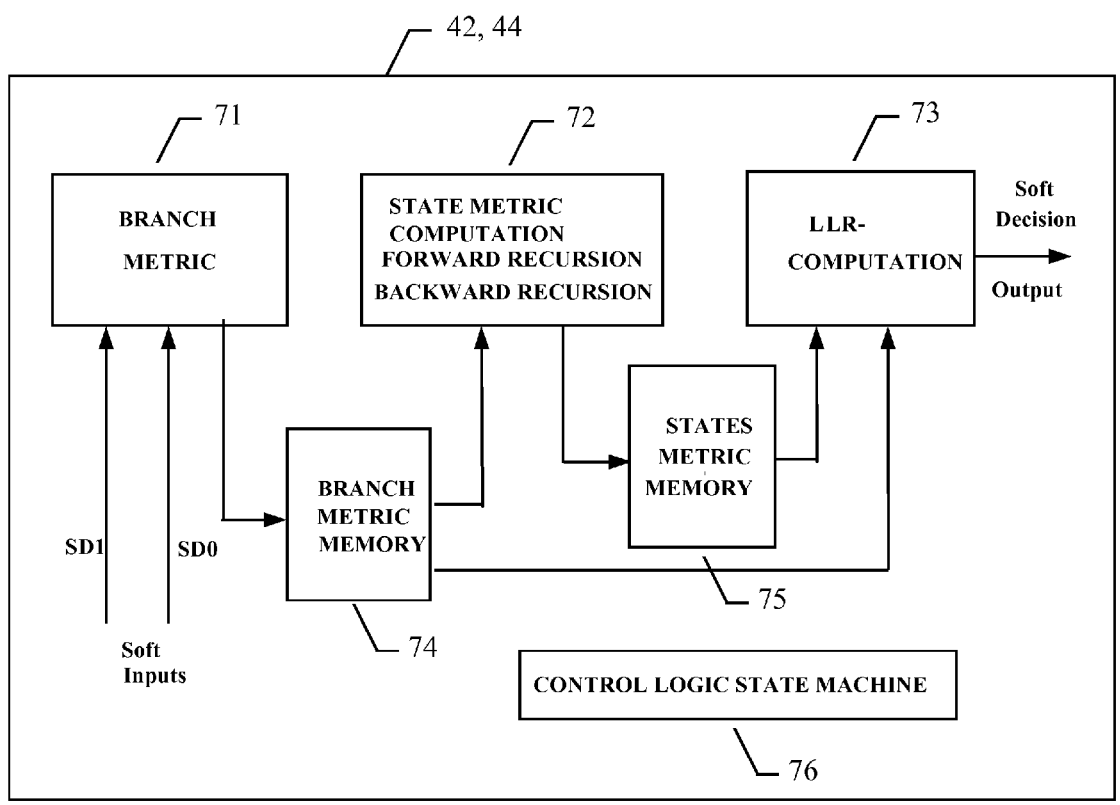
FIGURE 7. The SISO Log-MAP Decoder

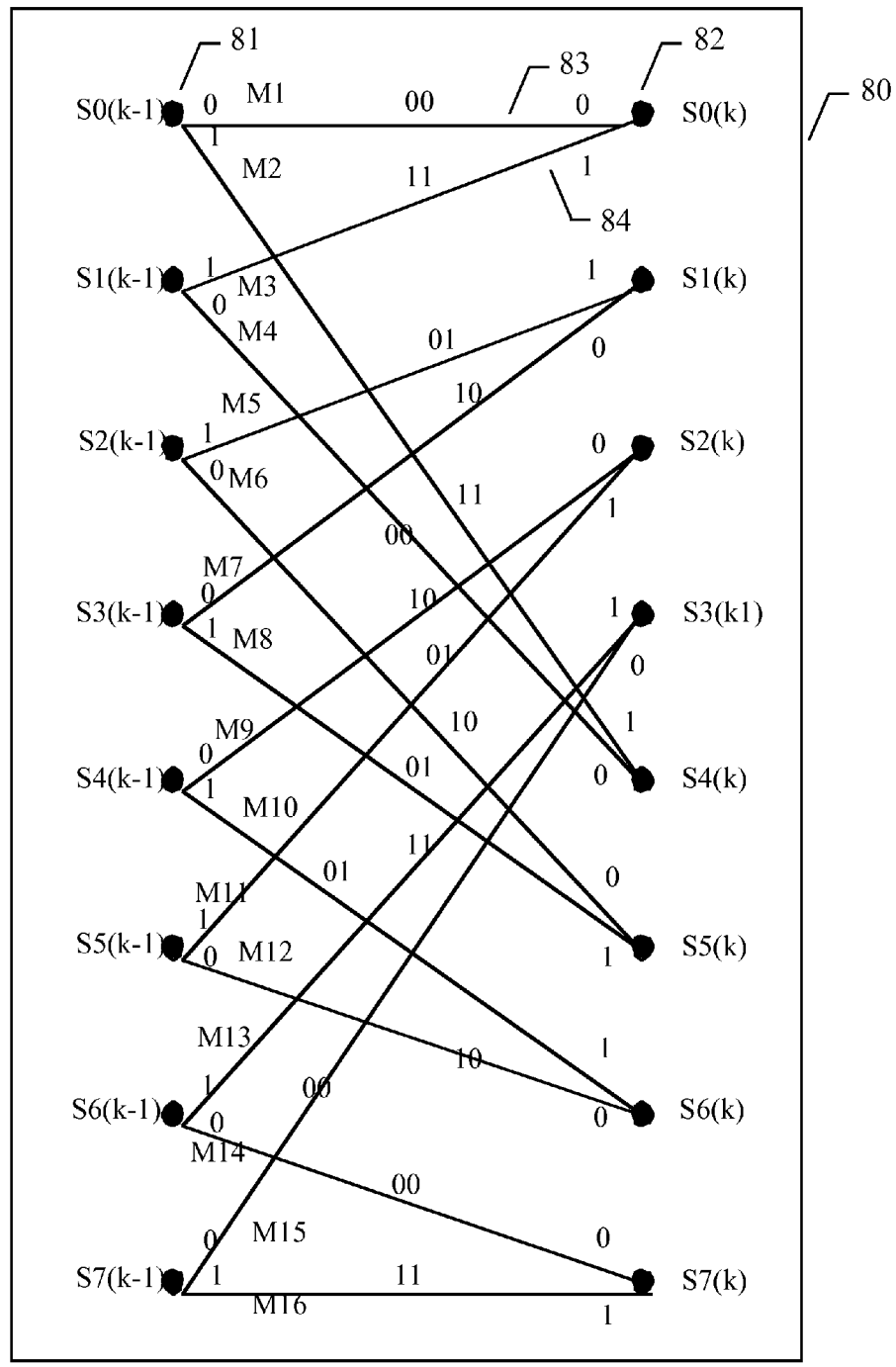
FIGURE 8. The 8-STATES TRELLIS DIAGRAM of a SISO Log-MAP Decoder

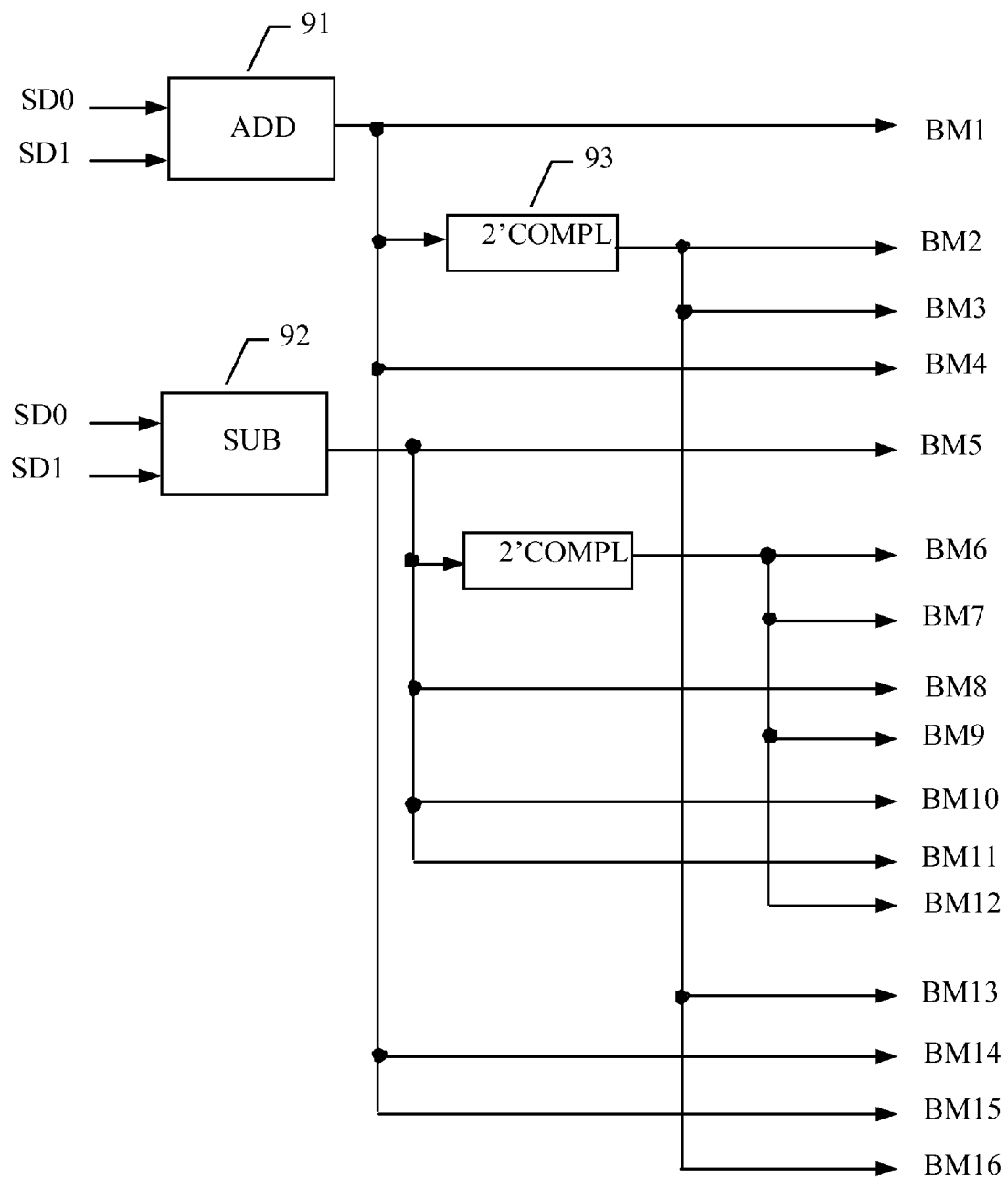
FIGURE 9. BRANCH METRIC COMPUTING MODULE

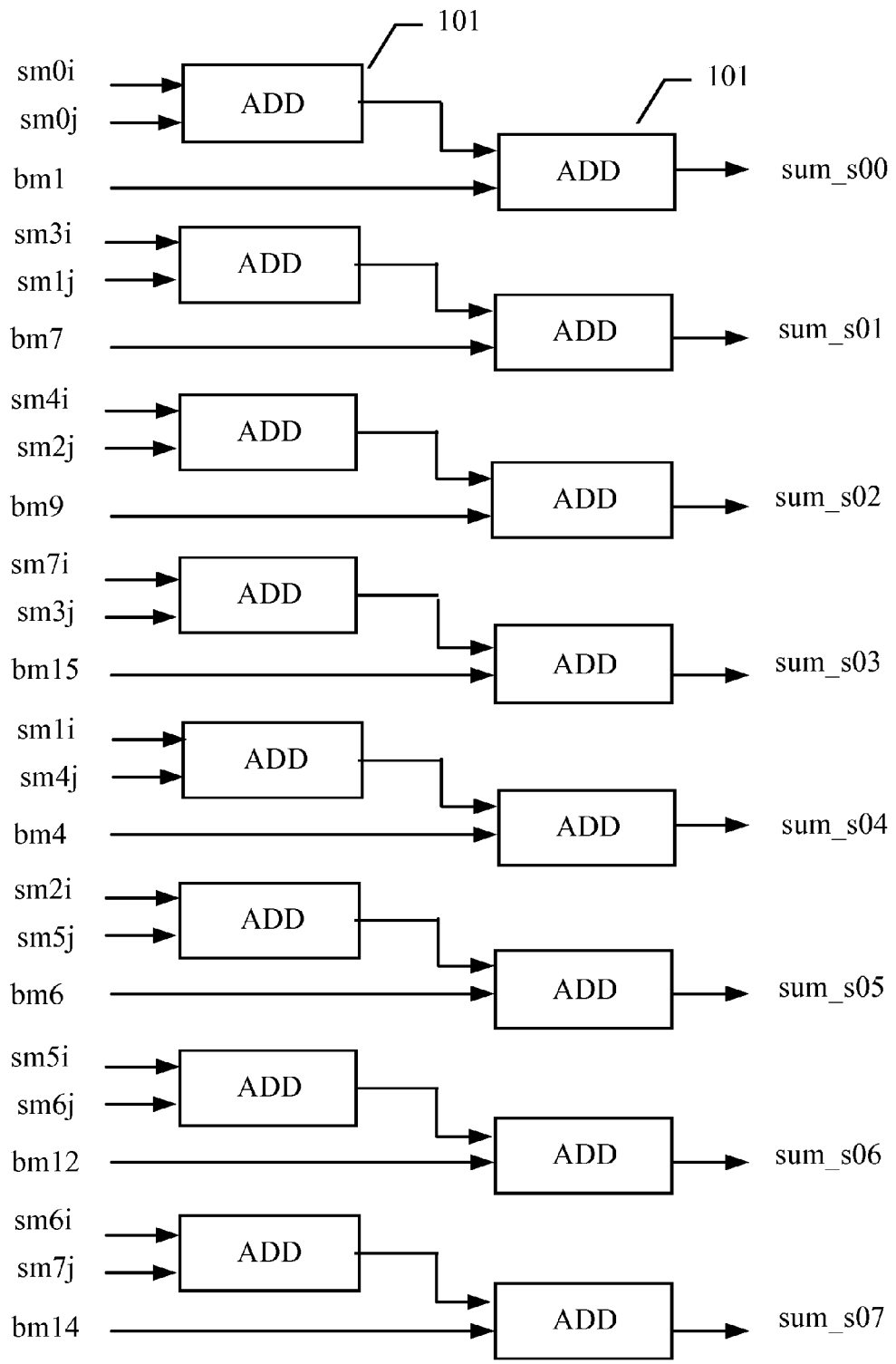
FIGURE 10a. LOG-MAP COMPUTING MODULE

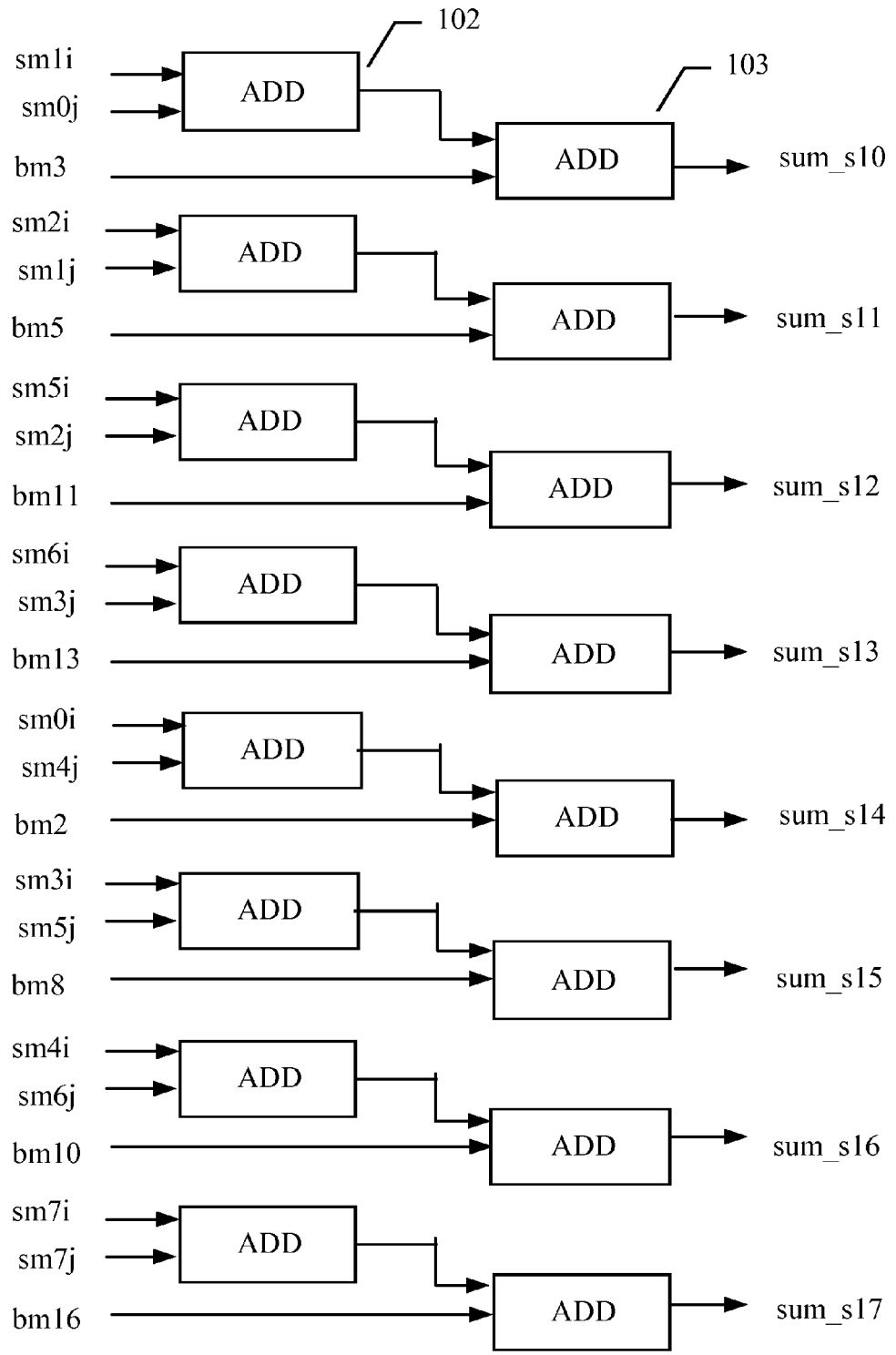
FIGURE 10b. LOG-MAP COMPUTING MODULE

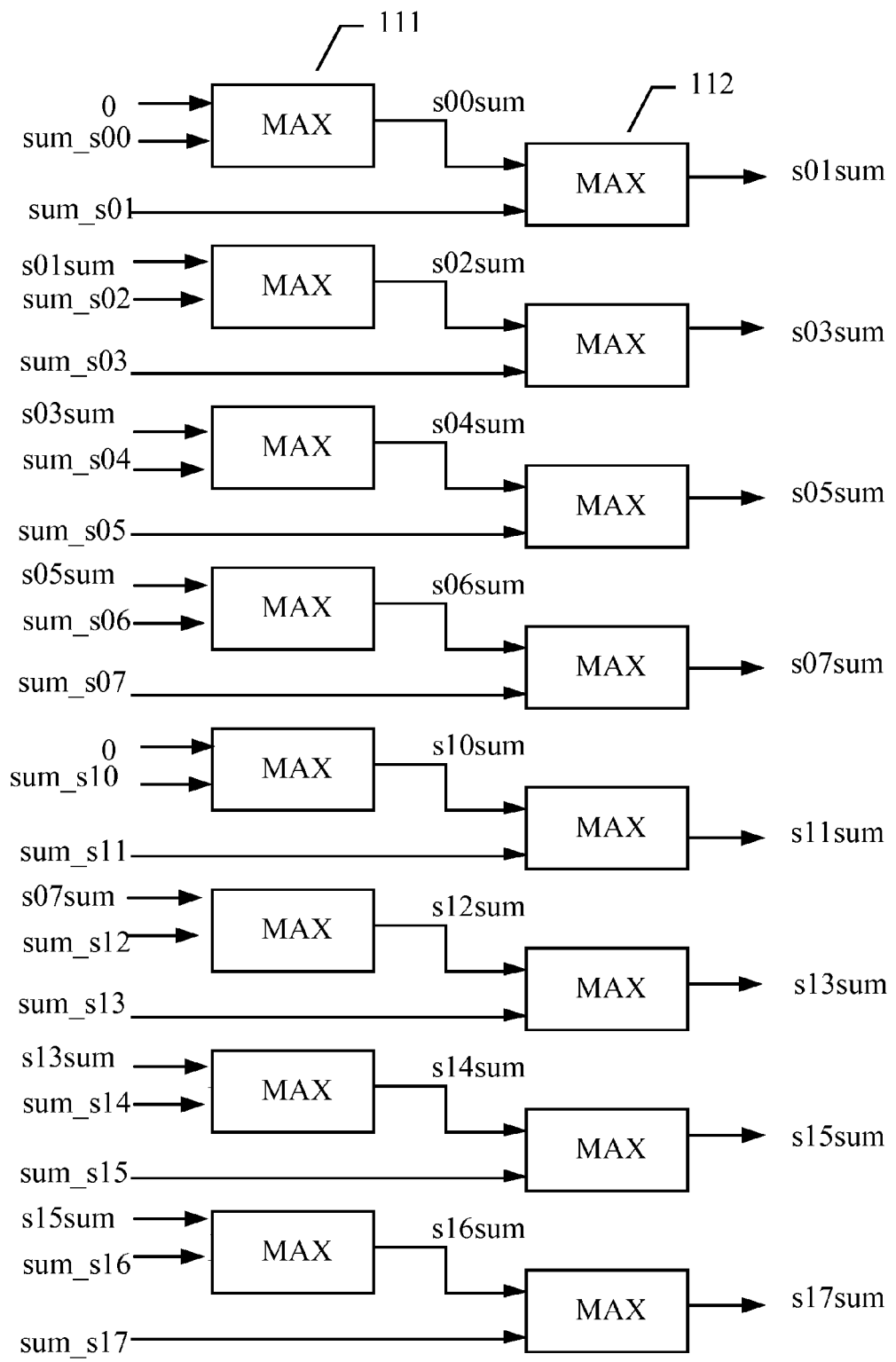
FIGURE 11. Computing Log-MAP for each state

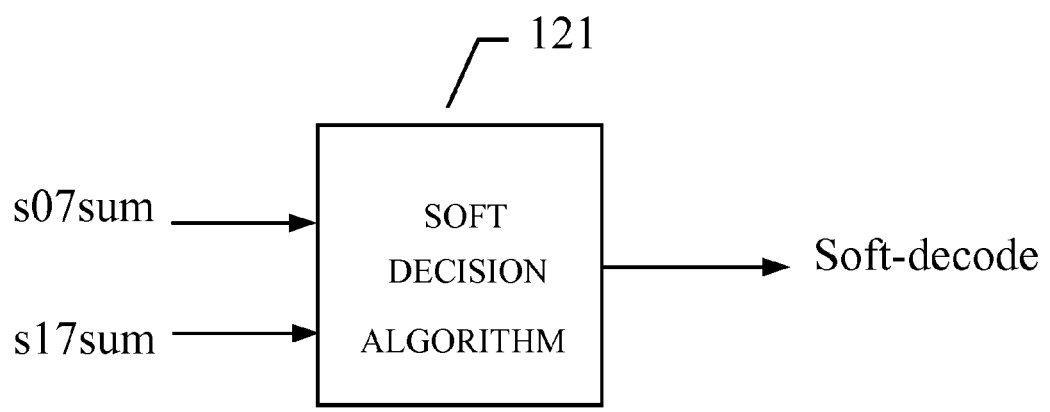
FIGURE 12. Soft Decode output

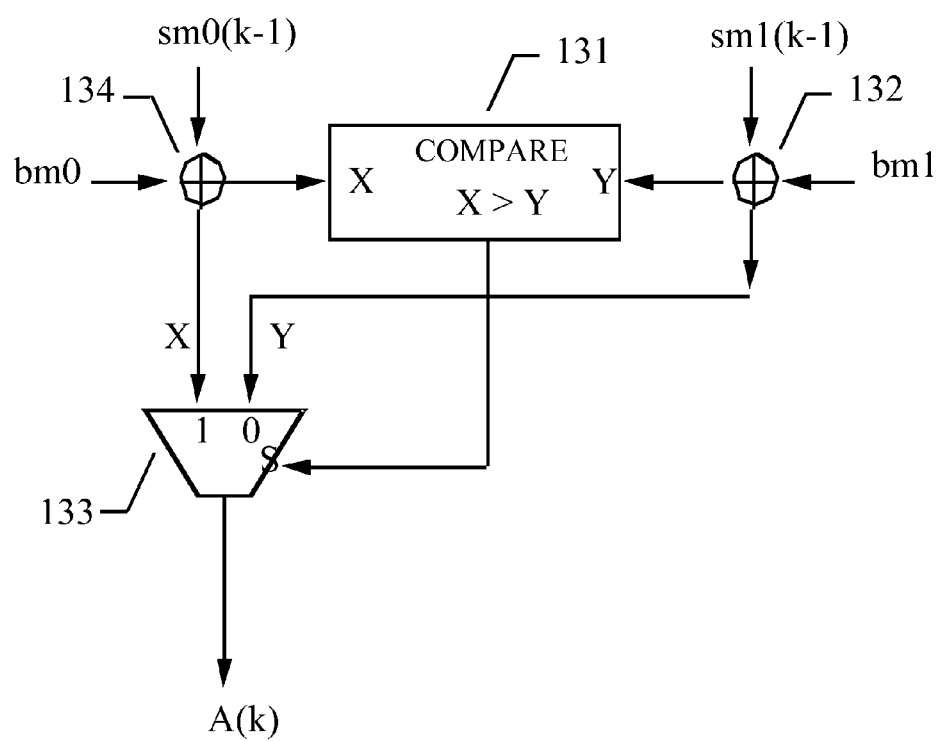
FIGURE 13. Computation of Forward Recursion of state-metric (ACS)

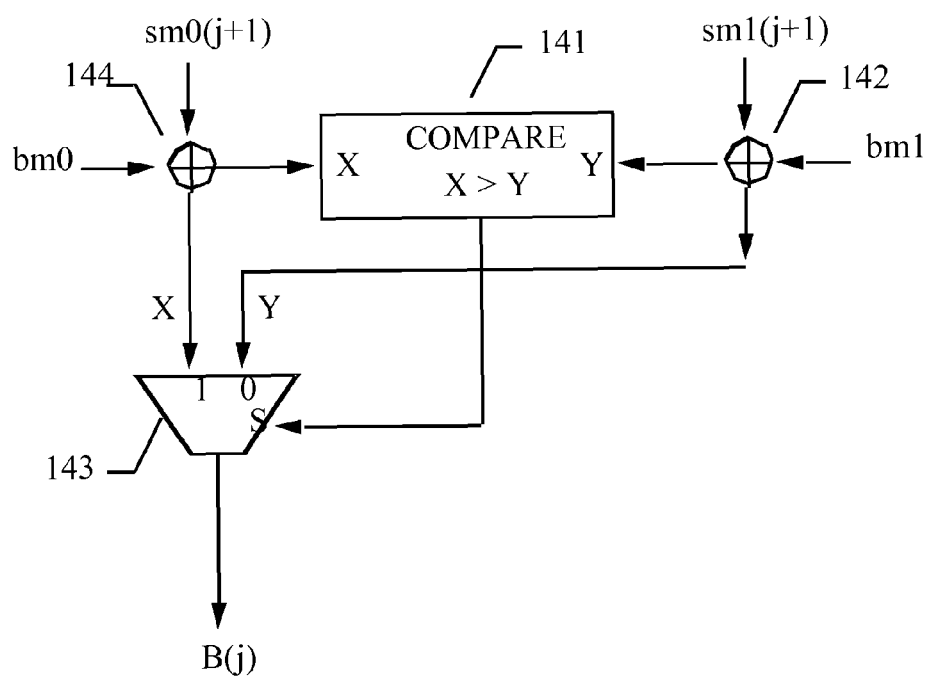
FIGURE 14. Computation of Backward Recursion of state-metric (ACS)

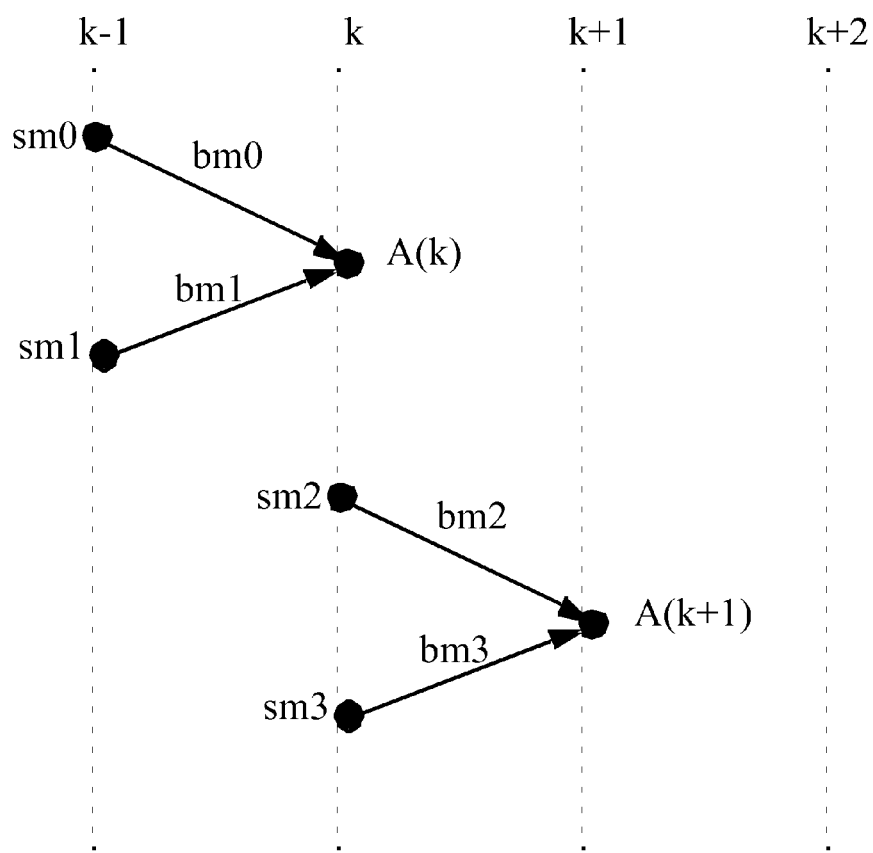
FIGURE 15. Forward computing of Trellis state transitions

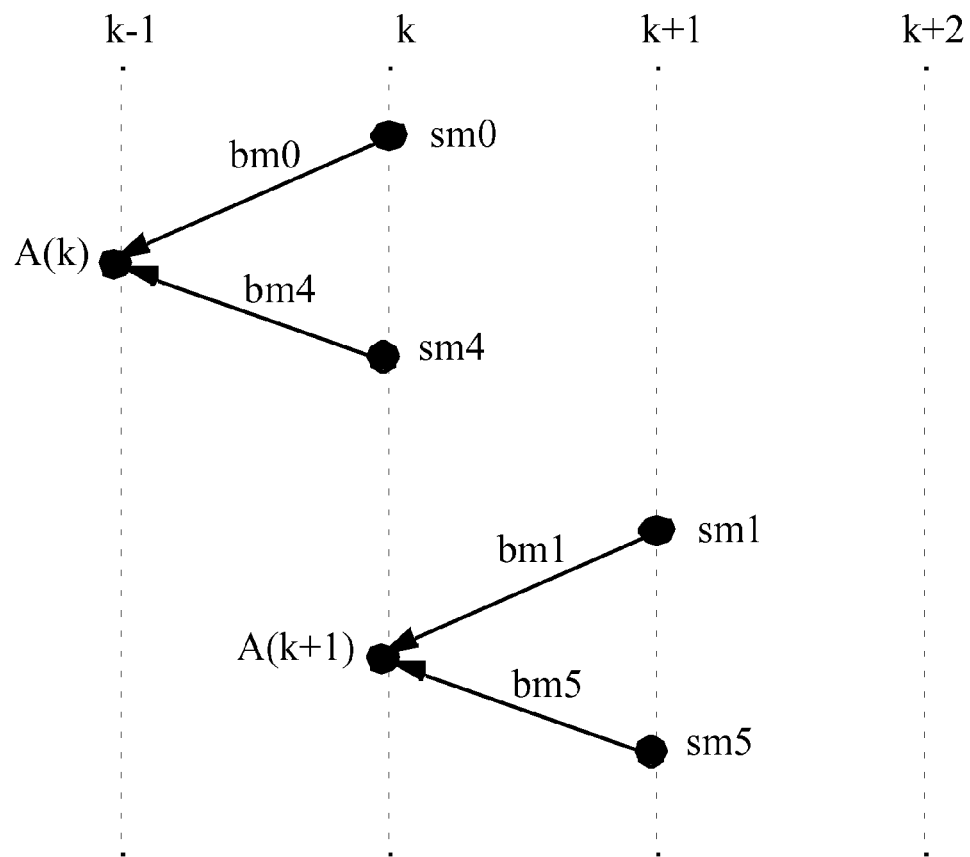
FIGURE 16. Backward computing of Trellis state transitions

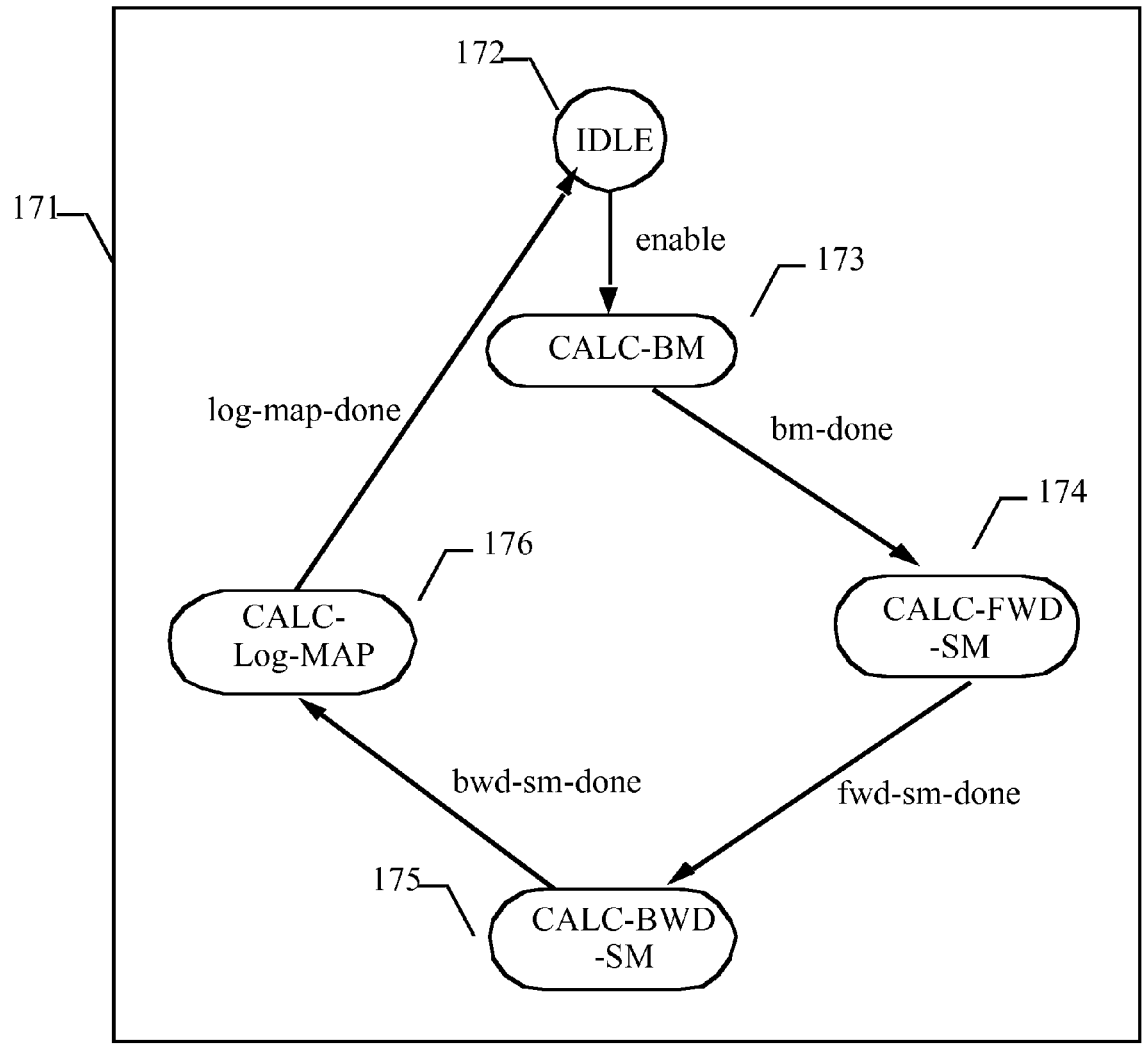
FIGURE 17. State machine operations of Log-MAP Decoder

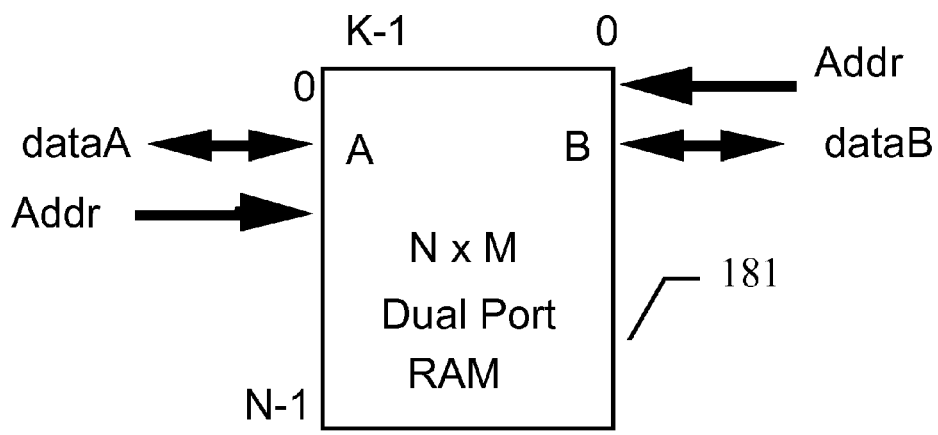
FIGURE 18. BM dual-port Memory Module
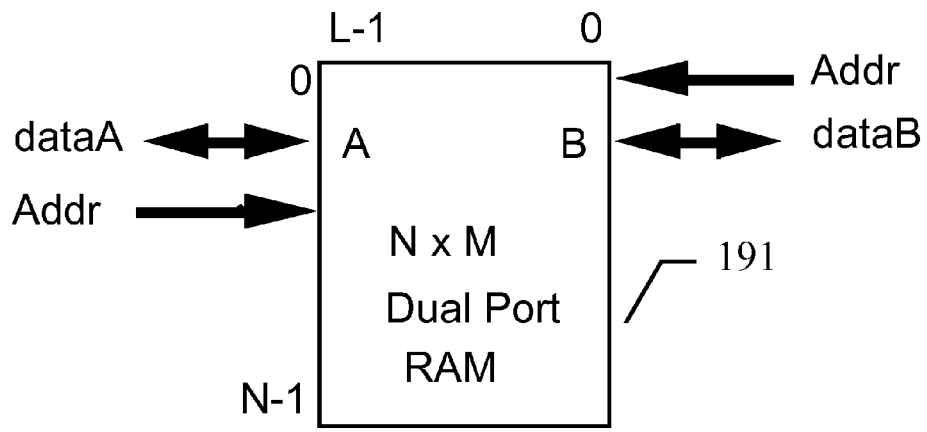
FIGURE 19. SM dual-port Memory Module

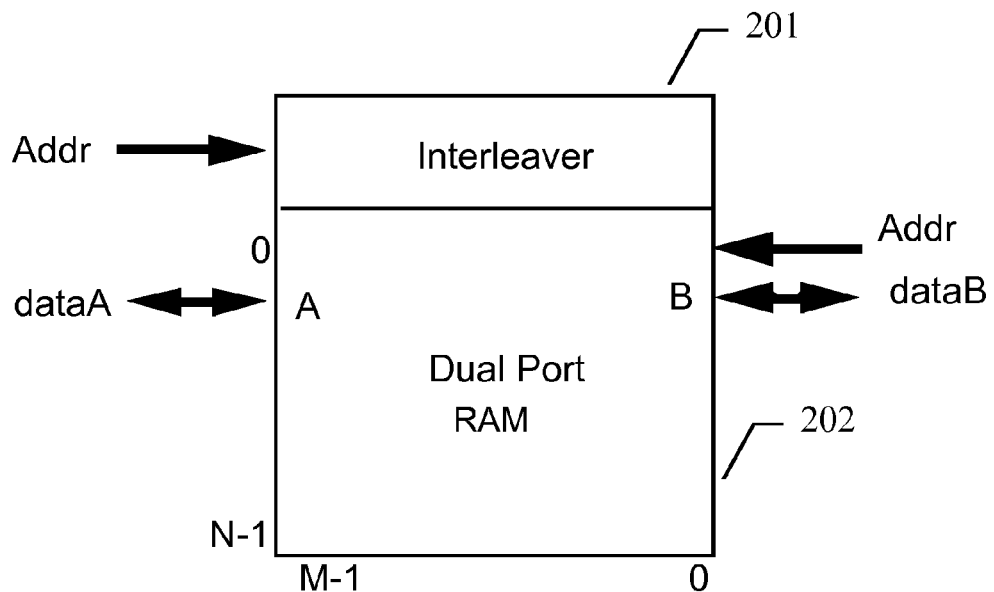
FIGURE 20. Interleaver MEMORY Input Buffer Module for R2
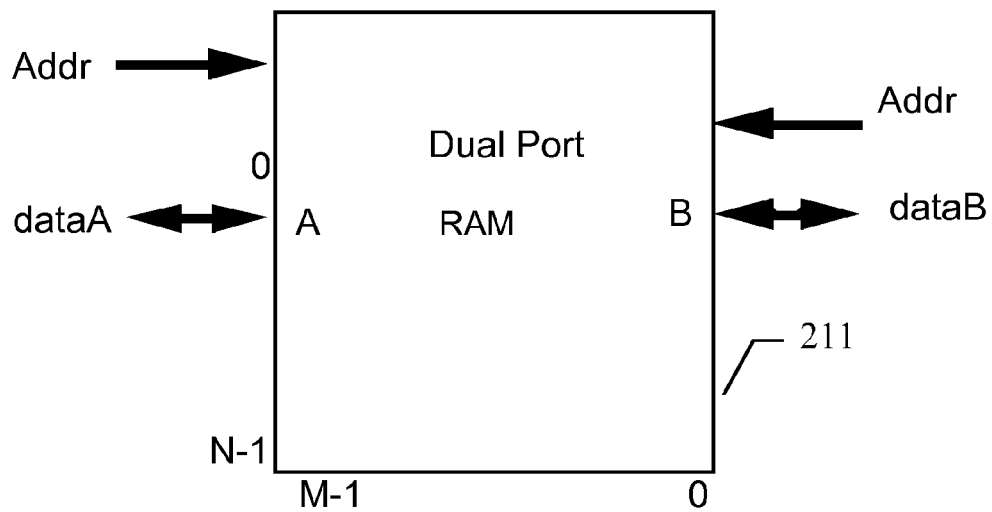
FIGURE 21. MEMORY Input Buffer Module for R0, R1

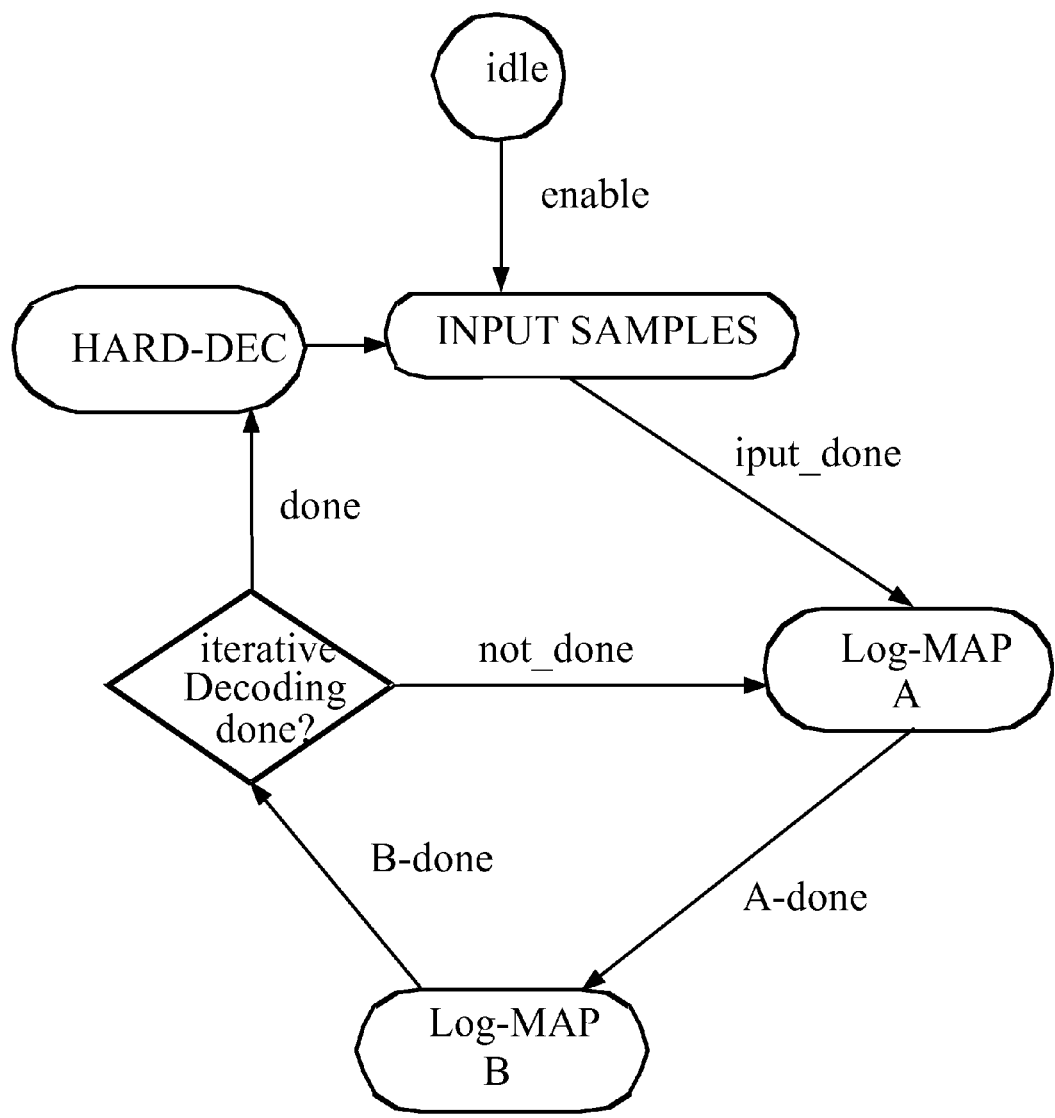
FIGURE 22. State machine operations of Turbo Decoder

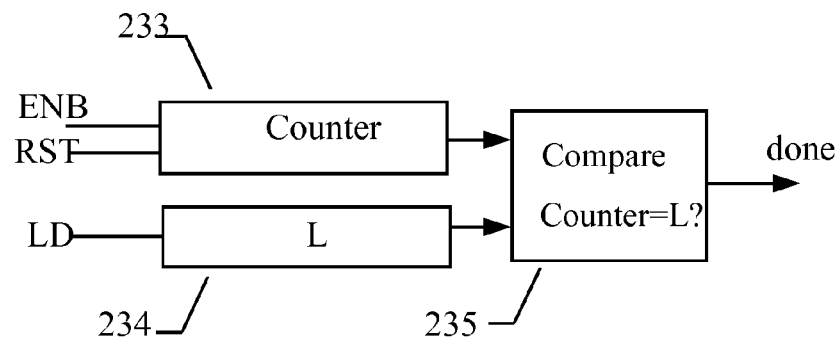
FIGURE 23. Iterative decoding L times
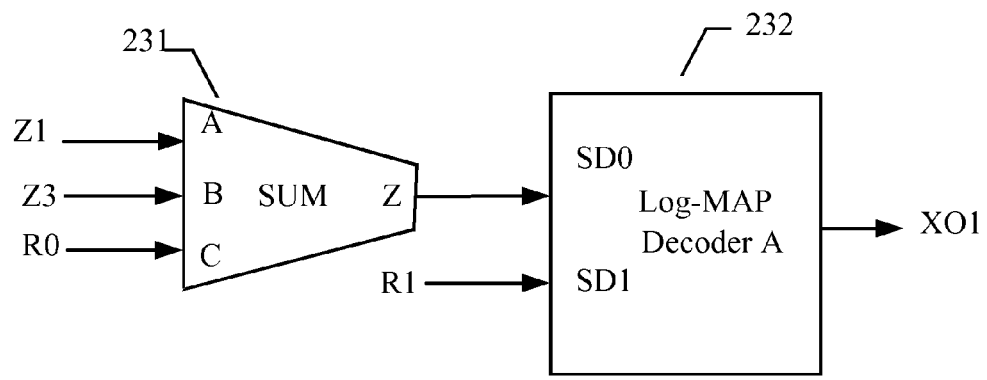
FIGURE 24. Intrinsic values feed-back sum, and diversity processing

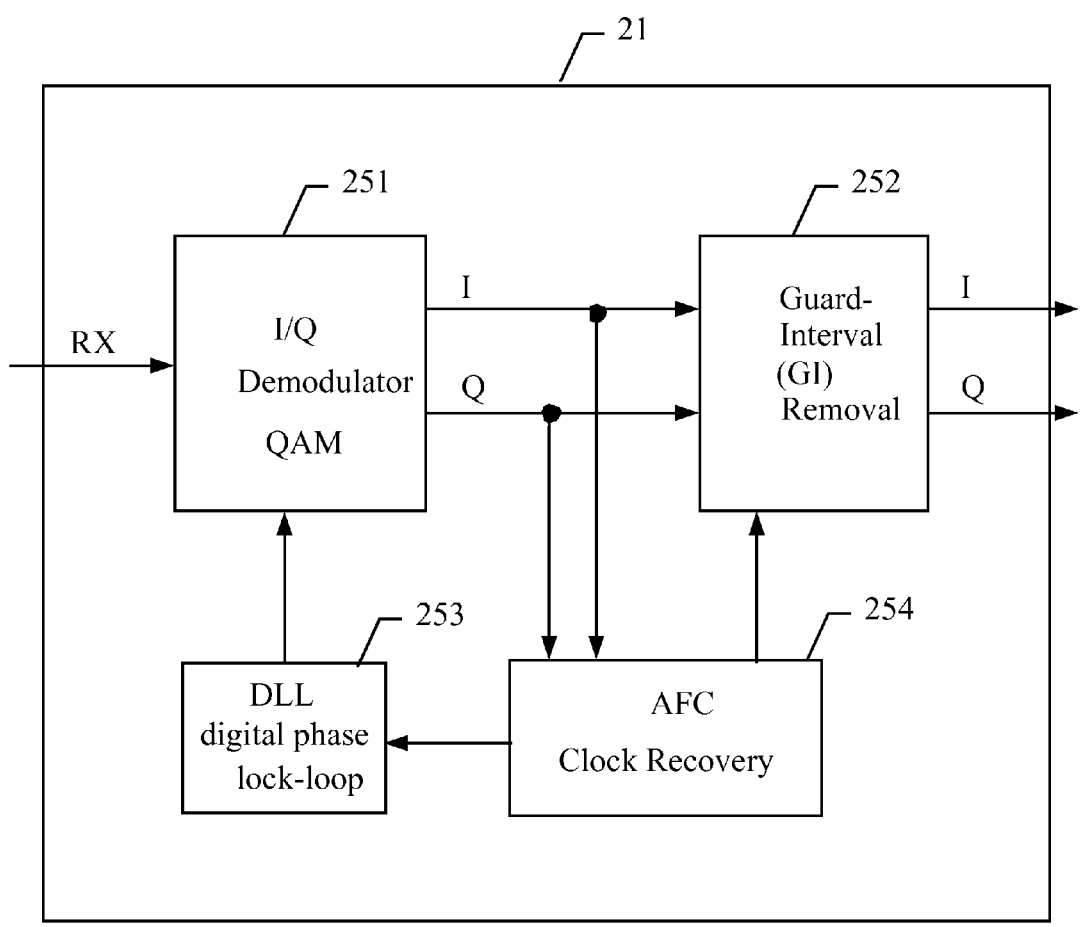
FIGURE 25. Pre-Processor for Baseband Processor Sub-systems

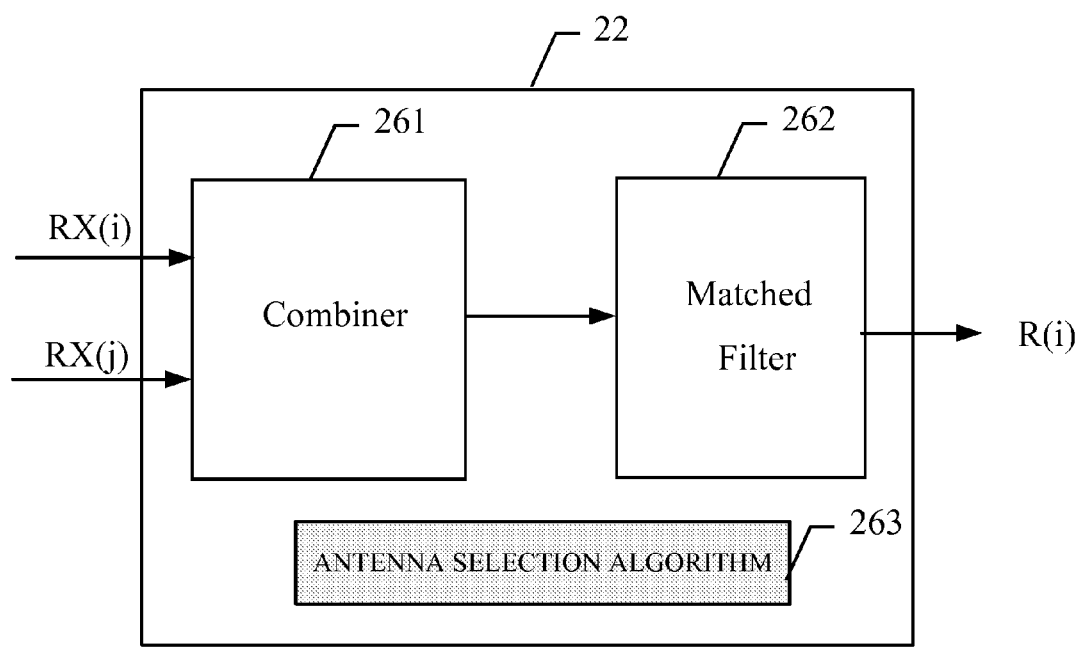
FIGURE 26. Diversity Processor

HIGH SPEED TURBO CODES DECODER FOR 3G USING PIPELINED SISO LOG-MAP DECODERS ARCHITECTURE

CROSS REFERENCE TO RELATED APPLICATIONS

This application is a continuation-in-part of U.S. patent application Ser. No. 12/173,799 filed Jul. 15, 2008 which is a continuation-in-part of U.S. patent application Ser. No. 90/008,190 filed Aug. 25, 2006 which is a continuation-in-part of U.S. patent application Ser. No. 10/248,245 filed Dec. 30, 2002 now U.S. Pat. No. 6,799,295 which is a continuation-in-part of U.S. patent application Ser. No. 09/681,093 filed Jan. 2, 2001 now U.S. Pat. No. 6,813,742.

FIELD OF THE INVENTION

This invention relates to MIMO system Wireless Baseband Processors and Forward Error-Correction (FEC) Codes (Turbo Codes Decoder) for $3^{rd}$ Generation (3G) Wireless Mobile Communications. More particularly, the invention relates to a very high speed MIMO Baseband Processor sub-systems implementing diversity processing of multipath signals from multiple antenna and pipelined Max Log-MAP decoders for 3G Wideband Code Division Multiple Access (W-CDMA), 3G Code Division Multiple Access (CDMA2000) and Wireless LAN (WLAN).

BACKGROUND OF THE INVENTION

Diversity processing computes signals from two or more separate antennas using so-called "multipath" signals that arrive at the terminal via different routes after being reflected from buildings, trees or hills. Diversity processing can increase the signal to noise ratio (SNR) more than 6 dB, which enables 3G systems to deliver data rates up to 200 Mbit/s. A multiple-input multiple-output (MIMO) employed multiple antennas at both transmitter and the receiver for data transmission. The MIMO system can provide improved performance over fading channel and multi-path channel.

The Orthogonal Frequency Division Multiplexing is a technique used to divide the broadband channel into sub-channels where multiple adjacent channels transmit their carriers' frequency, which are orthogonal to each other. The sum of all carriers can be transmitted over the air to the receiver where each channel's carrier can be separated without loss of information due to interferences.

Turbo Codes decoding is based upon the classic forward error correction concepts that include the use of concatenated Decoders and Interleavers to reduce $E_b/N_0$ for power-limited wireless applications such as digital Wireless Mobile Communications.

A Turbo Codes Decoder is an important part of baseband processor of the digital wireless communication Receiver, which was used to reconstruct the corrupted and noisy received data and to improve BER ($10^{-9}$) throughput. FIG. 1 shows an example of a diversity processing wireless systems with a M-Channels Baseband Processor sub-systems 12 which decodes signals RX(0), RX(1) to RX(M−1) from multiple Receivers 11 and multiple Antennas 13, and sends decoded data to the Media Access Control (MAC) layer 14. The signals received from two or more separate antennas 13 using so-called "multipath" signals that arrive at the terminal via different routes after being reflected from buildings, trees or hills pass through two or more Receivers 11 to produce multiple orthogonal signals RX(0) to RX(M−1) for the M-Channels Baseband Processor sub-systems 12.

DESCRIPTION OF PRIOR ART

A widely used Forward Error Correction (FEC) scheme is the Viterbi Algorithm Decoder in both wired and wireless applications. A drawback of the Viterbi Algorithm Decoder is that it requires a long wait for decisions until the whole sequence has been received. A delay of six times the memory processing speed of the received data is required for decoding. One of the more effective FEC schemes, with higher complexity, uses a maximum a posteriori (MAP) algorithm to decode received messages. The MAP algorithm is computationally complex, requiring many multiplications and additions per bit to compute the posteriori probability. A major difficulty with the use of the MAP algorithm has been the implementation in semiconductor ASIC devices. The complexity of the multiplications and additions slow down the decoding process and reduce the throughput data rates. Furthermore, even under the best conditions, multiplication operations in the MAP algorithm requires implementation using large circuits in the ASIC. The result is costly design and low performance in bit rates throughput.

Recently, the $3^{rd}$ Generation Partnership Project (3GPP) organization introduced a new class of error correction codes using parallel concatenated codes (PCCC) that include the use of the classic recursive systematic constituent (RSC) Encoders and Interleavers as shown in FIG. 3. An example of the 3GPP Turbo Codes PCCC with 8-states and rate ⅓ is shown in FIG. 3. Data enters the two systematic encoders 31 33 separated by an interleaver 32. An output codeword consists of the source data bit followed by the output bits of the two encoders.

Other prior work relating to error correction codes was performed by Berrou et al., describing parallel concatenated codes which are complex encoding structures that are not suitable for portable wireless device. Another U.S. Pat. No. 6,023,783 to Divsalar et al. describes an improved encoding method over Berrou et al., using mathematical concepts of parallel concatenated codes. However, patents by Berrou et al., Divsalar et al., and others only describe the concept of parallel concatenated codes using mathematical equations which are good for research in deep space communications and other government projects, but are not feasible, economical, and suitable for consumer portable wireless devices. In these prior systems, the encoding of data is simple and can be easily implemented with a few "xor" and flip-flop logic gates. But decoding the Turbo Codes is much more difficult to implement in ASIC or software. The prior art describes briefly the implementation of the Turbo Codes Decoder which are mostly for deep space communications and requires much more hardware, power consumption and costs.

All the prior art Turbo Codes fail to provide simple and suitable methods and architectures for a Turbo Codes Decoder as it is required and desired for 3G cellular phones and 3G personal communication devices, including the features of high speed data throughput, low power consumption, lower costs, limited bandwidth, and limited power transmitter in noisy environments.

SUMMARY OF INVENTION

The present invention is directed to a MIMO Diversity M-channels Baseband Processor sub-system using diversity processing to improve error-rate of data transmission and to implement a more efficient, practical and suitable architecture and method to increase the signal to noise ratio (SNR), and to achieve the requirements for wireless systems, including the features of higher speed data throughput, lower power consumptions, lower costs, and suitable for implementation in ASIC or DSP codes. The diversity is achieved by paring two orthogonal channels for processing multipath data to improve receiver performance output. The present invention encompasses several improved and simplified Turbo Codes Decoder methods and devices to deliver higher speed and lower power consumption, especially for applications. Diversity processing can increase the signal to noise ratio (SNR) more than 6 dB, which enables wireless systems to deliver data rates up to 200 Mbit/s. As shown in FIG. 2, an exemplary embodiment of the Diversity M-channels Baseband Processor sub-system 12 utilizes a Diversity Rpocessor 22, an N-point Complex FFT Processor 24, and a Turbo Codes Decoder 23 for diversity processing. Each Turbo Codes Decoder 23 has two serially concatenated Soft-input Soft-output logarithm maximum a posteriori (SISO Log-MAP) Decoders 42, 44. The two decoders function in a pipelined scheme with delay latency N. While the first decoder is decoding data stored in the second-decoder-Memory 45, the second decoder performs decoding for data stored in the first-decoder-Memory 43, which produces a decoded output every clock cycle. As shown in FIG. 6, the Turbo Codes Decoder 23 utilizes a Sliding Window of Block N 61 on the Memory 41 to decode data per block N, which improves processing efficiency. The invention presents a method to divide the wireless broadband into multiple sub-channels and uses an Orthogonal Frequency Division Multiplexing method implemented by N-point complex FFT processors to effectively divide the broadband high-speed channel into multiple slow-speed N sub-channels where multiple adjacent channels transmit their carriers' frequency which are orthogonal to each other. The high-speed bit-stream is also sub-divided into multiple slow-speed sub bit-streams. For example, if the total broadband channel capacity is R-Mbps, then the slower sub-channel capacity S-Mbps is equal to (R-Mbps)/N. The slower sub-channel capacity benefits the Turbo Codes baseband processor since it performs much better at a slower bit rate with a greater number of iterations. Each bit-stream is encoded one bit per cycle with the Turbo Codes encoder and then mapped into an 8-PSK constellation point where its I and Q components are mapped into the real and imaginary part of the complex FFT point. Since M is less than or equal to N, channel hopping can be accomplished by assigning a bit-stream to a new channel once its current channel becomes noisy. Accordingly, several objects and advantages of the Diversity M-channels Baseband Processor sub-system 12 are:

To implement diversity processing to increase the signal to noise ratio (SNR).

To deliver higher speed throughput and be suitable for implementation in application specific integrated circuit (ASIC) designs or digital signal processor (DSP) codes.

To utilize SISO Log-MAP decoders for best result and faster decoding and simplified implementation in ASIC circuits and DSP codes with the use of binary adders for computation.

To perform re-iterative decoding of data back-and-forth between the two Log-MAP decoders in a pipelined scheme until a decision is made. In such pipelined scheme, decoded output data is produced each clock cycle.

To utilize a Sliding Window of Block N on the input buffer memory to decode data per block N for improved pipeline processing efficiency To provide higher performance in term of symbol error probability and low BER ($10^{-9}$) for 3G applications such as 3G WCDMA, and 3G CDMA2000 operating at very high bit-rate up to 200 Mbps, in a low power, noisy environment.

To utilize a simplified and improved SISO Log-MAP decoder architecture, including a branch-metric (BM) calculations module, a recursive state-metric (SM) forward/backward calculations module, an Add-Compare-Select (ACS) circuit, a Log-MAP posteriori probability calculations module, and an output decision module.

To reduce complexity of multiplier circuits in MAP algorithm by performing the entire MAP algorithm in Log Max approximation using binary adder circuits, which are more suitable for ASIC and DSP codes implementation, while still maintaining a high level of performance output.

To design an improve Log-MAP Decoder using high level design language (HDL) such as Verilog, system-C and VHDL, which can be synthesized into custom ASIC and Field Programmable Gate Array (FPGA) devices. To implement an improve Log-MAP Decoder in DSP (digital signal processor) using optimized high level language C, C++, or assembly language.

To utilize an Orthogonal Frequency Division Multiplexing method implemented by N-point complex FFT processors to sub-divide the broadband high-speed channel into multiple slow-speed N sub-channels.

Still further objects and advantages will become apparent to one skill in the art from a consideration of the ensuing descriptions and accompanying drawings.

BRIEF DESCRIPTION OF DRAWINGS

FIG. 1 illustrates a conventional MIMO Receiver Functional Block Diagram which uses Diversity M-channels Baseband Processor sub-system.

FIG. 2 illustrates a Diversity M-channels Baseband Processor sub-system.

FIG. 3 illustrates a block diagram of a prior-art 8-states 3GPP Parallel Concatenated Convolutional Codes.

FIG. 4 illustrates the Turbo Codes Decoder System Block Diagram showing Log-MAP Decoders, Interleavers, Memory Buffers, Hard-decoder, and control logics.

FIG. 5 illustrates a Turbo Codes Decoder State Diagram.

FIG. 6 illustrates the Block N Sliding Window Diagram.

FIG. 7 illustrates a block diagram of the SISO Log-MAP Decoder showing Branch Metric module, State Metric module, Log-MAP module, and State and Branch Memory modules.

FIG. 8 illustrates the 8-States Trellis Diagram of a SISO Log-MAP Decoder using the 3GPP 8-state PCCC Turbo codes.

FIG. 9 illustrates a block diagram of the BRANCH METRIC COMPUTING module.

FIG. 10a illustrates a block diagram of the Log-MAP computing for u=0.

FIG. 10b illustrates a block diagram of the Log-MAP computing for u=1.

FIG. 11 illustrates a block diagram of the Log-MAP Compare & Select 1 maximum logic for each state.

FIG. 12 illustrates a block diagram of the Soft Decode module.

FIG. 13 illustrates a block diagram of the Computation of Forward Recursion of State Metric module (FACS).

FIG. 14 illustrates a block diagram of the Computation of Backward Recursion of State Metric module (BACS).

FIG. 15 illustrates State Metric Forward computing of Trellis state transitions.

FIG. 16 illustrates State Metric Backward computing of Trellis state transitions.

FIG. 17 illustrates a block diagram of the State Machine operations of Log-MAP Decoder.

FIG. 18 illustrates a block diagram of the BM dual-port Memory Module.

FIG. 19 illustrates a block diagram of the SM dual-port Memory Module.

FIG. 20 illustrates a block diagram of the Interleaver dual-port RAM Memory.

FIG. 21 illustrates a block diagram of the De-Interleaver dual-port RAM Memory.

FIG. 22 illustrates a flow chart of an exemplary Turbo Codes Decoder state machine operation.

FIG. 23 illustrates a block diagram of the Iterative decoding feedback control.

FIG. 24 illustrates a block diagram of the intrinsic feedback Adder of the Turbo Codes Decoder.

FIG. 25 illustrates a pre-processor for baseband processor sub-system.

FIG. 26 illustrates a Diversity Processor.

DETAILED DESCRIPTION

Turbo Codes Decoder

An illustration of a 3GPP 8-state Parallel Concatenated Convolutional Code (PCCC), with coding rate ⅓, constraint length K=4 is illustrated in FIG. 3. An implementation using SISO Log-MAP Decoders is illustrated in FIG. 4.

In accordance with an exemplary embodiment, a Turbo Codes Decoder block 23 has concatenated max Log-MAP SISO Decoders A 42 and B 44 connected in a feedback loop with Interleaver Memory 43 and Interleaver Memory 45.

Signals R2, R1, R0 are received soft decision signals of data path from the system receiver. Signals XO1 and XO2 are output soft decision signals of the Log-MAP Decoders A 42 and B 44, respectively, which are stored in the Interleaver Memory 43 and Memory 45 module. Signals Z2 and Z1 are the output of the Interleaver Memory 43 and Interleaver Memory 45. Z2 is fed into Log-MAP decoder B 44 and Z1 is looped back into Log-MAP decoder A 42 through Adder 231.

Each Interleaver Memory 43, 45, shown in FIG. 20, includes one interleaver 201 and a dual-port RAM memory 202. Input Memory block 41, shown in FIG. 21, includes dual-port RAM memory 211. Control logic module (CLSM) 47 consists of various state-machines, which control all the operations of the Turbo Codes Decoder. The hard-decoder module 46 outputs the final decoded data.

More particularly, as illustrated in FIG. 3, R0, is data bit corresponding to the transmit data bit u, R1, is the first parity bit corresponding to the output bit of the first RSC encoder, and R2, is interleaved second parity bit corresponding to the output bit of the second RSC encoder.

In accordance with the invention, corresponding ones of data bits R0 is added to the feedback signals Z1, then fed into the decoder A. Corresponding ones of data bits R1 is also fed into decoder A for decoding the first stage of decoding output X01. Z2 and corresponding ones of R2 are fed into decoder B for decoding the second stage of decoding output XO2.

In accordance with the invention, as shown in FIG. 6, the Turbo Codes Decoder utilizes a Sliding Window of Block N 61 on the input buffers 62 to decode one block N data at a time, the next block N of data is decoded after the previous block N is done in a circular wrap-around scheme for pipeline operations. In another embodiment, the Sliding Window of Block N is used on the input buffer Memory so that each block N data is decoded at a time one block after another in a pipeline scheme.

In accordance with the invention, the Turbo Codes Decoder decodes an 8-state Parallel Concatenated Convolutional Code (PCCC). The Turbo Codes Decoder also decodes a higher n-state Parallel Concatenated Convolutional Code (PCCC)

As illustrated in FIG. 4, the Turbo Codes Decoder functions effectively as follows:

Received soft decision data (RXD[2:0]) is stored in three input buffers Memorys 41 to produce data bits R0, R1, and R2 that correspond to data words. Each output data word R0, R1, R2 contains a number of binary bits.

A Sliding Window of Block N is imposed onto each interleaver memory blocks 43, 45 to produce corresponding ones output data words.

A Sliding Window of Block N is imposed onto each input memory to produce corresponding ones of R0, R1, and R2, output data words.

In accordance with the method of the invention, when an input data block of size N is ready, the Turbo Decoder starts the Log-MAP Decoder A, in block 23, to decode the N input data based on the soft-values of R0, Z1, and R1, then stores the outputs in the Interleaver Memory A.

The Turbo Decoder also starts the Log-MAP Decoder B, in block 23, to decode the N input data based on the soft-values of R2 and Z2, in pipelined mode with a delay latency of N, then stores the output in the Interleaver Memory.

The Turbo Decoder performs iterative decoding for L number of times (L=1, 2, . . . , M).

When the iterative decoding sequence is complete, the Turbo Decoder starts the hard-decision operations to compute and produce soft-decision outputs.

SISO Log-MAP Decoder

As shown in FIG. 7, SISO Log-MAP Decoders 42, 44 include a Branch Metric (BM) computation module 71, a State Metric (SM) computation module 72, a Log-MAP computation module 73, a BM Memory module 74, a SM Memory module 75, and a Control Logic State Machine module 76. Soft-value inputs enter the Branch Metric (BM) computation module 71, where Euclidean distance is calculated for each branch, the output branch metrics are stored in the BM Memory module 74. The State Metric (SM) computation module 72 reads branch metrics from the BM Memory 74 and computes the state metric for each state; the output state-metrics are stored in the SM Memory module 75. The Log-MAP computation module 73 reads both branch-metrics and state-metrics from BM memory 74 and SM memory 75 modules to compute the Log Maximum a Posteriori probability and produce soft-decision output. The Control Logic State-machine module 76 provides the overall operations of the decoding process.

As shown in FIG. 7 which is one example of 3GPP Turbo Codes Decoder, the Log-MAP Decoder 42 44 functions effectively as follows:

The Log-MAP Decoder 42, 44 reads each soft-values (SD) data pair input, then computes branch-metric (BM) values for all paths in the Turbo Codes Trellis 80 as shown in FIG. 8a (and Trellis 85 in FIG. 8b). The computed BM data is stored into BM Memory 74. The process of computing BM values is repeated for each input data until all N samples are calculated and stored in BM Memory 74.

The Log-MAP Decoder 42 44 reads BM values from BM Memory 74 and SM values from SM Memory 75, and computes the forward state-metric (SM) for all states in the Trellis 80 as shown in FIG. 8a (and Trellis 85 in FIG. 8b). The computed forward SM data is stored into SM Memory 75.

The process of computing forward SM values is repeated for each input data until all N samples are calculated and stored in SM Memory 75.

The Log-MAP Decoder 42 44 reads BM values from BM Memory 74 and SM values from SM Memory 75, and computes the backward state-metric (SM) for all states in the Trellis 80 as shown in FIG. 8*a* (and Trellis 85 in FIG. 8*b*). The computed backward SM data is stored into the SM Memory 75. The process of computing backward SM values is repeated for each input data until all N samples are calculated and stored in SM Memory 75.

The Log-MAP Decoder 42 44 then computes Log-MAP posteriori probability for u=0 and u=1 using the BM values and SM values from BM Memory 74 and SM Memory 75. The process of computing Log-MAP posteriori probability is repeated for each input data until all N samples are calculated. The Log-MAP Decoder then decodes data by making soft decision based on the posteriori probability for each stage and produces soft-decision output, until all N inputs are decoded.

Branch Metric Computation Module

The Branch Metric (BM) computation module 71 computes the Euclidean distance for each branch in the 8-states Trellis 80 as shown in the FIG. 8*a* based on the following equations:

Local Euclidean distances values=$SD0*G0+SD1*G1$ where SD0 and SD1 are soft-value input data and G0 and G1 are the expected input for each path in the Trellis 80. G0 and G1 are coded as signed antipodal values, meaning that 0 corresponds to +1 and 1 corresponds to −1. Therefore, the local Euclidean distances for each path in the Trellis 80 are computed by the following equations:

$M1=SD0+SD1$ $M2=-M1$ $M3=M2$ $M4=M1$ $M5=-SD0+SD1$ $M6=-M5$ $M7=M6$ $M8=M5$ $M9=M6$ $M10=M5$ $M11=M5$ $M12=M6$ $M13=M2$ $M14=M1$ $M15=M1$ $M16=M2$

As shown in the exemplary embodiment of FIG. 9, the Branch Metric Computing module includes one L-bit Adder 91, one L-bit Subtracter 92, and a 2' complemeter 93. The Euclidean distances is computed for path M1 and M5. Path M2 is 2' complement of path M1. Path M6 is 2' complement of M5. Path M3 is the same path M2, path M4 is the same as path M1, path M7 is the same as path M6, path M8 is the same as path M5, path M9 is the same as path M6, path M10 is the same as path M5, path M11 is the same as path M5, path M12 is the same as path M6, path M13 is the same as path M2, path M14 is the same as path M1, path M15 is the same as path M1, and path M16 is the same as path M2.

State Metric Computing Module

The State Metric Computing module 72 calculates the probability A(k) of each state transition in forward recursion and the probability B(k) in backward recursion. FIG. 13 shows the implementation of state-metric in forward recursion with Add-Compare-Select (ACS) logic. FIG. 14 shows the implementation of state-metric in backward recursion with Add-Compare-Select (ACS) logic. The calculations are performed at each node in the Turbo Codes Trellis 80 (FIG. 8*a*) in both forward and backward recursion. FIG. 15 shows the forward state transitions in the Turbo Codes Trellis 80 (FIG. 8*a*). FIG. 16 shows the backward state transitions in the Turbo Codes Trellis 80 (FIG. 8*a*). Each node in the Trellis 80 as shown in FIG. 8*a* has two entering paths: one-path 84 and zero-path 83, from the two nodes in the previous stage.

In an exemplary embodiment, the ACS logic includes an Adder 132, an Adder 134, a Comparator 131, and a Multiplexer 133. In the forward recursion, the Adder 132 computes the sum of the branch metric and state metric in the one-path 84 from the state s(k−1) of previous stage (k−1). The Adder 134 computes the sum of the branch metric and state metric in the zero-path 83 from the state (k−1) of previous stage (k−1). The Comparator 131 compares the two sums and the Multiplexer 133 selects the larger sum for the state s(k) of current stage (k). In the backward recursion, the Adder 142 computes the sum of the branch metric and state metric in the one-path 84 from the state s(j+1) of previous stage (J+1). The Adder 144 computes the sum of the branch metric and state metric in the zero-path 83 from the state s(j+1) of previous stage (J+1). The Comparator 141 compares the two sums and the Multiplexer 143 selects the larger sum for the state s(j) of current stage (j).

The Equations for the ACS are shown below:

$A(k)=\text{MAX}[(bm0+sm0(k-1)),(bm1+sm1(k-1))]$ $B(j)=\text{MAX}[(bm0+sm0(j+1)),(bm1+sm1(j+1))]$ Time (k−1) is the previous stage of (k) in forward recursion as shown in FIG. 15, and time (j+1) is the previous stage of (j) in backward recursion as shown in FIG. 16.

Log-MAP Computing Module

The Log-MAP computing module calculates the posteriori probability for u=0 and u=1, for each path entering each state in the Turbo Codes Trellis 80 corresponding to u=0 and u=1 or referred as zero-path 83 and one-path 84. The accumulated probabilities are compared and the u with larger probability is selected. The soft-decisions are made based on the final probability selected for each bit. FIG. 10*a* shows the implementation for calculating the posteriori probability for u=0. FIG. 10*b* shows the implementation for calculating the posteriori probability for u=1. FIG. 11 shows the implementation of compare-and-select for the u with larger probability. FIG. 12 shows the implementation of the soft-decode compare logic to produce output bits based on the posteriori probability of u=0 and u=1. The equations for calculating the accumulated probabilities for each state and compare-and-select are shown below:

$\text{sum\_}s00=sm0i+bm1+sm0j$ $\text{sum\_}s01=sm3i+bm7+sm1j$ $sum\_s02 = sm4i + bm9 + sm2j$ $sum\_s03 = sm7i + bm15 + sm3j$ $sum\_s04 = sm1i + bm4 + sm4j$ $sum\_s05 = sm2i + bm6 + sm5j$ $sum\_s06 = sm5i + bm12 + sm6j$ $sum\_s07 = sm6i + bm14 + sm7j$ $sum\_s10 = sm1i + bm3 + sm0j$ $sum\_s11 = sm2i + bm5 + sm1j$ $sum\_s12 = sm5i + bm11 + sm2j$ $s00sum = MAX[sum\_s00, 0]$ $s01sum = MAX[sum\_s01, s00sum]$ $s02sum = MAX[sum\_s02, s01sum]$ $s03sum = MAX[sum\_s03, s02sum]$ $s04sum = MAX[sum\_s04, s03sum]$ $s05sum = MAX[sum\_s05, s04sum]$ $s06sum = MAX[sum\_s06, s05sum]$ $s07sum = MAX[sum\_s07, s06sum]$ $s10sum = MAX[sum\_s10, 0]$ $s11sum = MAX[sum\_s11, s10sum]$ $s12sum = MAX[sum\_s12, s11sum]$ $s13sum = MAX[sum\_s13, s12sum]$ $s14sum = MAX[sum\_s14, s13sum]$ $s15sum = MAX[sum\_s15, s14sum]$ $s16sum = MAX[sum\_s16, s15sum]$ $s17sum = MAX[sum\_s17, s16sum]$ Control Logics—State Machine (CLSM) Module As shown in FIG. 7, the Control Logic module controls the overall operations of the Log-MAP Decoder. The control logic state machine 171, referred as CLSM, is shown in FIG. 17. The CLSM module 171 (FIG. 17) operates effectively as follows. Initially, the CLSM module 171 operates in IDLE state 172. When the decoder is enabled, the CLSM module 171 transitions to CALC-BM state 173, where the Branch Metric (BM) module starts operations and monitors for completion. When Branch Metric calculations are completed, referred to as bm-done, the CLSM transitions to CALC-FWD-SM state 174, where the State Metric module (SM) begins forward recursion operations. When the forward SM state metric calculations are completed, referred to as fwd-sm-done, the CLSM transitions to CALC-BWD-SM state 175, where the State Metric module (SM) begins backward recursion operations. When backward SM state metric calculations are completed, referred to as bwd-sm-done, the CLSM transitions to CALC-Log-MAP state 176, where the Log-MAP computation module begins calculating the maximum a posteriori (MAP) probability to produce soft decode output.

When Log-MAP calculations are completed, referred to as log-map-done, the CLSM module 171 transitions back to IDLE state 172.

BM Memory and SM Memory

The Branch-Metric Memory 74 and the State-Metric Memory 75 are shown in FIG. 7 as the data storage components for BM module 71 and SM module 72. The Branch Metric Memory module is a dual-port RAM that contains M-bits of N memory locations as shown in FIG. 18. The State Metric Memory module is a dual-port RAM that contains K-bits of N memory locations as shown in FIG. 19. Data can be written into one port while reading at the other port.

Interleaver Memory

As shown in FIG. 4, the Interleaver Memory A 43 stores data for the first decoder A 42 and Interleaver Memory B 45 stores data for the second decoder B 44. In iterative pipelined decoding, the decoder A 42 reads data from Interleaver Memory B 45 and writes results data into Interleaver Memory B 43, the decoder B 44 reads data from Interleaver Memory A 43 and write results into Interleaver Memory B 45.

As shown in FIG. 20, the De-Interleaver memory 41 includes a De-Interleaver module 201 and a dual-port RAM 202, which contains M-bits of N memory locations. The Interleaver is a Turbo code internal interleaver as defined by 3GPP standard ETSI TS 125 222 V3.2.1 (2000-05), or other source. The Interleaver permutes the address input port A for all write operations into dual-port RAM module. Reading data from output port B are done with normal address input.

The Interleaver Memory module uses an interleaver to generate the write-address sequences of the Memory core in write-mode. In read-mode, the memory core read-address is normal sequences.

As shown in FIG. 21, the Input Buffer Memory 43 45 comprises of a dual-port RAM 211, which contains M-bits of N memory locations.

Turbo Codes Decoder Control Logics—State Machine (TDCLSM

As shown in FIG. 4, the Turbo Decoder Control Logics module 47, referred to as TDCLSM, controls the overall operations of the Turbo Codes Decoder. Log-MAP A 42 starts the operations of data in Memory B 45. At the same time, Log-MAP B starts the operations in Memory A 43. When Log-MAP A 42 and Log-MAP B 44 finish with block N of data, the TDCLSM 47 starts the iterative decoding for L number of times. When the iterative decoding sequences are completed, the TDCLSM 47 transitions to HARD-DEC to generate the hard-decode outputs. Then the TDCLSM 47 transitions to start decoding another block of data.

Iterative Decoding

Turbo Codes decoder performs iterative decoding by feeding back the output Z1, Z3 of the second Log-MAP decoder B into the corresponding first Log-MAP decoder A before making decision for hard-decoding output. As shown in FIG. 23, the Counter 233 counts the preset number L times.

Diversity M-Channels Baseband Processor Sub-System

An implementation of a Diversity M-channels Baseband Processor sub-system is illustrated in FIG. 2 for processing multiple orthogonal received signals RX(0) to RX(M−1) from multipath signals which arrive at the antennas after being reflected from buildings, trees or hills.

In accordance with an exemplary embodiment, a Diversity M-channels Baseband Processor sub-system 12 comprises a Turbo Codes Decoders 23, an N-point Complex-FFT Processor 24 (Fast Fourier Transform) for demodulating orthogonal signals RX(0) to RX(M−1), M-multiple of Pre-processors 21 for pre-processing of orthogonal signals RX(0) to RX(M−1), and a Diversity Processor 22.

In accordance with an exemplary embodiment, each identical Pre-processor 21 contains an I/Q Demodulator 251, a Guard-interval Removal 252 for removing cyclic prefix, a clock recovery (AFC) 254 for reconstructing the clock, and the DLL digital phase-lock-loop 253 for re-sync and timing-correction.

In accordance with an exemplary embodiment, the Diversity Processor 22 contains a Combiner 261 for processing a pair of diversity channel RX(i) and RX(j), and a Matched Filter 262 for generate an output signal R(k).

In accordance with an exemplary embodiment, the N-point Complex FFT Processor 24 process orthogonal signals from diversity M-channels R(i).

In accordance with an exemplary embodiment, the Diversity M-channels Baseband Processor sub-system functions effectively as follows:

The received orthogonal signals RX(0) to RX(M−1) were initially processed by the I/Q Demodulator 251 for demodulating the RX signal into baseband I/Q components.

The baseband I/Q components are then passed thru a Guard-interval Removal 252 for removing cyclic prefix to produce the clean I/Q baseband signals.

A clock recovery (AFC) 254 computes I/Q signals to calculate the phase-error during transmission due to noise and multipath fading effect. The phase-error output is used to drive the digital phase-lock-loop to correct sample timing for I/Q demodulator to produce better quality of signals.

The baseband I/Q components are then passed thru a Diversity Processor 22 for further processing of multipath signals.

The I and Q components are then passed to the N-point complex FFT Processor 24. The FFT Processor 24 performs the complex Fast Fourier Transform (FFT) for the I and Q sequences of N samples to transform them into N points of complex-coefficient outputs.

In accordance with an exemplary embodiment, an N-point Complex-FFT Processor 24 processes each of the M-channels I/Q signals, where the I component is mapped into Real-coefficient input, and Q is mapped into the Imaginary-coefficient input of the FFT processor. The FFT processor processes I/Q signals and produce a set of complex-coefficient outputs that are fed into MUX 25 and then shifted into the Turbo Codes Decoder 23.

Each set of (I,Q) is loaded into the MUX 25 then shifted into the Turbo Codes Decoder baseband processor 23, where data is iteratively decoded until a final decision hard-decoded bit is produced for the output that correspond to each bit-stream.

In accordance with an exemplary embodiment, the Turbo Codes Decoder block 23 has concatenated max Log-MAP SISO Decoders A 42 and B 44 connected in a feedback loop with Interleaver Memory 43 and Interleaver Memory 45. Signals R2, R1, R0 are received soft decision signals from complex-coefficient output of the FFT processor.

N-Point Complex FFT Processor and the OFDM

The Orthogonal Frequency Division Multiplexing (OFDM) is a technique used to divide the broadband channel into sub-channels where multiple adjacent channels transmit their carriers' frequency, which are orthogonal to each other. The sum of all carriers can be transmitted over the air to the receiver where each channel's carrier can be separated without loss of information due to interferences. In OFDM the subcarrier pulse used for transmission is chosen to be rectangular. This has the advantage that the task of pulse forming and modulation can be performed by a simple Inverse Discrete Fourier Transform (IDFT). Accordingly in the receiver we only need a Forward FFT to reverse this operation. The invention presents a method to divide the broadband into multiple sub-channels and uses an Orthogonal Frequency Division Multiplexing method implemented by N-point complex FFT processors to effectively divide the broadband high-speed channel into multiple slow-speed N sub-channels where multiple adjacent channels transmit their carriers' frequency which are orthogonal to each other.

Forward Complex FFT takes sample data, multiplies it successively by complex exponentials over the range of frequencies, sums each product and produces the results as sequence of frequency coefficients. The results array of frequency coefficients is called a spectrum. The equation of a forward Complex FFT is shown below:

$$X(k) = \sum_{n=0}^{N-1} x(n)\sin(2\pi kn/N) + j\sum_{n=0}^{N-1} x(n)\cos(2\pi kn/N)$$

where x(n) are inputs sampled data and X(k) is sequence of frequency coefficients.

As shown in FIG. 2, an N-point complex FFT Processor 24 takes sampled data (I,Q) from the Diversity Processor 22 output where the "I" component is mapped as Real part and the "Q" component is mapped Imaginary part into the input of an N-point complex FFT processor. After processing period, the complex FFT processor then produces an output sequence of frequency coefficients. The sequence of frequency coefficients are then fed into the MUX 25 and shifted into the Turbo Codes Decoder 23.

Pre-Processor for Baseband Processing Sub-Systems

As shown in FIG. 25, an Pre-Processor 21 comprises an IQ demodulator 251 for demodulating the received signal into I and Q baseband signal components, a digital phase-lock-loop (DLL) and local carrier generator 253 produces phase-correct sample frequency, an a clock recovery (AFC Clock circuit) 254, a guard interval (GI) remover 252 for deleting guard interval.

In accordance with an exemplary embodiment, the Pre-Processor functions effectively as follows:

Received signals entering the IQ Demodulator 251 are demodulated with a local carrier to produce the I and Q component signals.

The I and Q signals are shifted completely through the Guard Interval Remover 252 where the cyclic-prefix is removed from each I and Q signal.

The I and Q signals are inputted into the Clock-Recovery circuit 254 where the I and Q sample will be phase detected and the phase-error will be calculated. The phase-error output will be used to control the DLL local carrier generator circuit 253.

Diversity Processing Sub-Systems

As shown in FIG. 26, the Diversity Processor 22 comprises a Combiner 261, a Matched Filter 262, and Antenna Selection Algorithm 263.

In accordance with an exemplary embodiment, the Diversity Processor 22 functions effectively as follows:

The Antennas Selection Algorithm will select an optimum pair of diversity channels. For each channel RX(i), the Algorithm 263 will find an adjacent channel RX(j) to form an optimum pair of diversity channels.

The Combiner 261 will combiner signals of the two diversity channel.

The Matched Filter 261 will process the signal ad produce an result output R(i).

We claim:

1. A MIMO system with diversity baseband processing for iteratively decoding data received on multiple data paths from at least two or multiple antennas, the MIMO baseband processing system comprising:
- at least one each Pre-Processor adapted to receive the data received on corresponding one of the multiple data paths RX(i), wherein each Pre-Processor comprises:
  - at least one I/Q Demodulator circuit to demodulated the receive signal into baseband component I and Q signals;
  - at least one Guard Interval Removal for removing cyclic-prefix;
  - at least one Clock Recovery circuit to calculate sampling error to control the Digital Phase locked-loop; and
  - a Digital Phase locked-loop circuit to produce the sampling clock for the I/Q Demodulator circuit;
- a Diversity Processor adapted to received signals from the Pre-Processors, wherein the Diversity Processor comprises:
  - an Algorithm to select the optimum pair of diversity channels;
  - a Combiner to combine the signals pair of diversity channels; and
  - a Matched Filter to produce an output signal of the diversity channels;
- a M-point Complex FFT Processor to process each of the M sub-channels;
- a MUX to convert the data from each channel into a serial stream of data; and
- a Turbo Codes Decoder to process the data stream from each channel to produce an error-free data output.

* * * * *